(12) United States Patent
Vandenberghe et al.

(10) Patent No.: US 8,120,115 B2
(45) Date of Patent: Feb. 21, 2012

(54) TUNNEL FIELD-EFFECT TRANSISTOR WITH GATED TUNNEL BARRIER

(75) Inventors: William G. Vandenberghe, Herverlee (BE); Anne S. Verhulst, Houtvenne (BE)

(73) Assignees: IMEC, Leuven (BE); Katholieke Universiteit Leuven, K.U. Leuven R&D, Leuven (BE)

( * ) Notice: Subject to any disclaimer, the term of this patent is extended or adjusted under 35 U.S.C. 154(b) by 391 days.

(21) Appl. No.: 12/044,719

(22) Filed: Mar. 7, 2008

(65) Prior Publication Data

US 2008/0224224 A1    Sep. 18, 2008

Related U.S. Application Data

(60) Provisional application No. 60/906,440, filed on Mar. 12, 2007.

(30) Foreign Application Priority Data

Jun. 4, 2007   (EP) ..................................... 07010947

(51) Int. Cl.
*H01L 29/66* (2006.01)
(52) U.S. Cl. .......... 257/365; 257/E29.264; 257/E21.421
(58) Field of Classification Search ................... 257/105
See application file for complete search history.

(56) References Cited

U.S. PATENT DOCUMENTS

| | | | |
|---|---|---|---|
| 4,288,806 A | | 9/1981 | Ronen |
| 4,454,524 A | * | 6/1984 | Spence ........................ 257/324 |
| 5,589,696 A | * | 12/1996 | Baba ............................. 257/105 |
| 6,720,619 B1 | * | 4/2004 | Chen et al. ................... 257/347 |
| 2005/0199950 A1 | | 9/2005 | Chau et al. |
| 2005/0274992 A1 | | 12/2005 | Appenzeller et al. |
| 2008/0001203 A1 | * | 1/2008 | Ishihara ........................ 257/314 |

FOREIGN PATENT DOCUMENTS

| | | |
|---|---|---|
| WO | WO 2004/004927 A2 | 1/2004 |
| WO | WO 2006/034887 A | 4/2006 |
| WO | WO 2006/073477 A | 7/2006 |
| WO | WO 2006/087044 A | 8/2006 |

OTHER PUBLICATIONS

Appenzeller et al., Comparing Carbon Nanotube Transistors—The Ideal Choice: A Novel Tunneling Device Design, IEEE Trans. Electron Devices, vol. 52, 2568, Dec. 2005.

Bhuwalka et al., A Simulation Approach to Optimize the Electrical Parameters of a Vertical Tunnel FET, IEEE Trans. Electron Devices, vol. 52, No. 7, Jul. 2005.

(Continued)

*Primary Examiner* — Marcos D. Pizarro
*Assistant Examiner* — Eva Yan Montalvo
(74) *Attorney, Agent, or Firm* — Knobbe Martens Olson & Bear LLP

(57) ABSTRACT

A tunnel field effect transistor (TFET) is disclosed. In one aspect, the transistor comprises a gate that does not align with a drain, and only overlap with the source extending at least up to the interface of the source-channel region and optionally overlaps with part of the channel. Due to the shorter gate, the total gate capacitance is reduced, which is directly reflected in an improved switching speed of the device. In addition to the advantage of an improved switching speed, the transistor also has a processing advantage (no alignment of the gate with the drain is necessary), as well as a performance improvement (the ambipolar behavior of the TFET is reduced).

22 Claims, 12 Drawing Sheets

OTHER PUBLICATIONS

European Search Report for EP 07010947, dated Aug. 30, 2007.

Kouwenhoven et al., "Excitation Spectra of Circular, Few-Electron Quantum Dots", Science, American Association for the Advancement of Science, Dec. 5, 1997, pp. 1788-1792, vol. 278, No. 5344, US.

Lee, C. "Single-Electron Tunneling Transistor in SIGE/SI Double-Barrier Structures", Semiconductor Science and Technology, IOP, vol. 13, No. 8A, pp. A115-A118, Bristol, GB, Aug. 1998.

Ono Yukinori et al., "Manipulation and detection of single electrons for future information processing", Journal of Applied Physics, American Institute of Physics, vol. 97, No. 3, Jan. 19, 2005, pp. 31101-31101, New York, USA.

Sze, S.M., et al., "Physics of Semiconductor Devices", John Wiley & Sons, Sep. 1981, pp. 105, 117-118.

Wang et al., Complementary Tunneling Transistor for Low Power Application, Solid-State Electronics vol. 48, pp. 2281-2286, May 6, 2004.

* cited by examiner

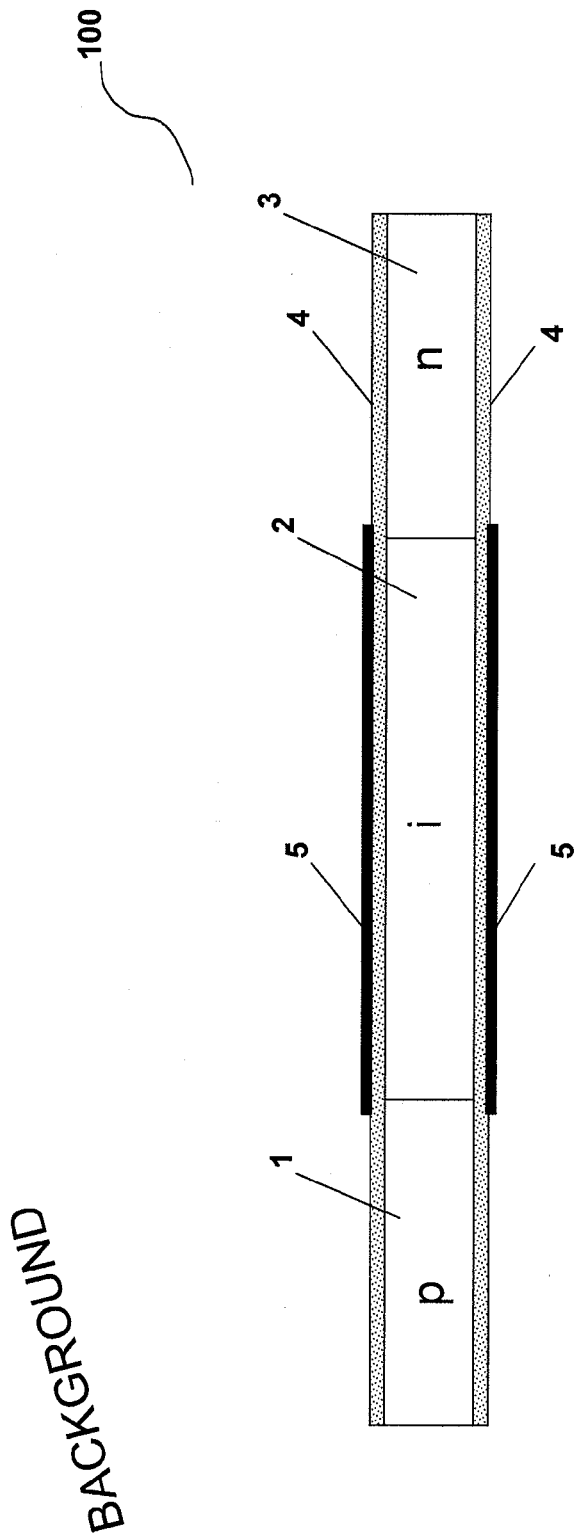

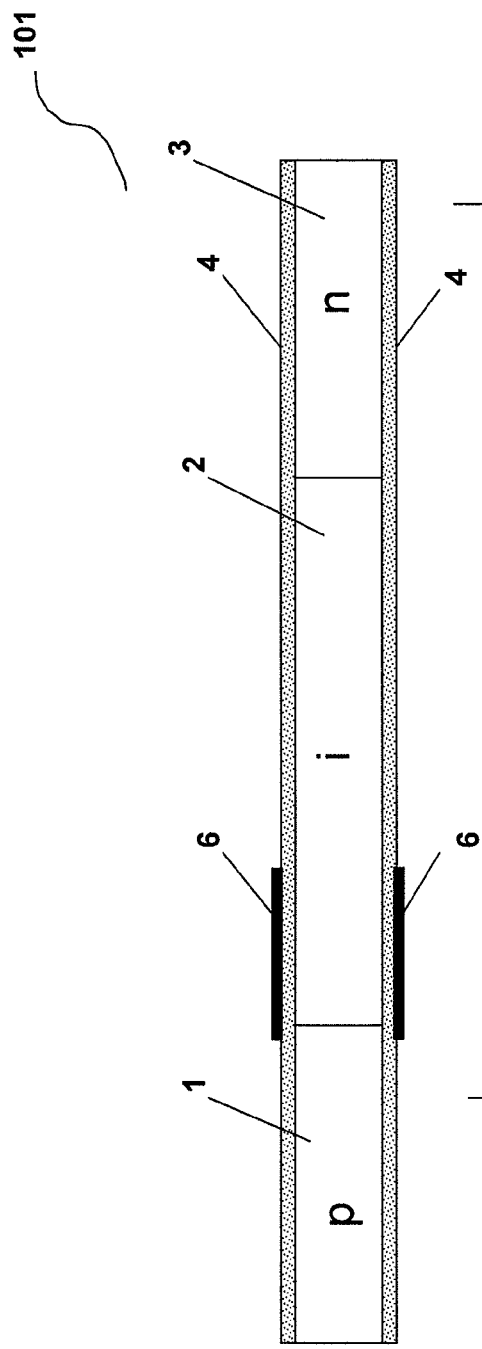

BACKGROUND

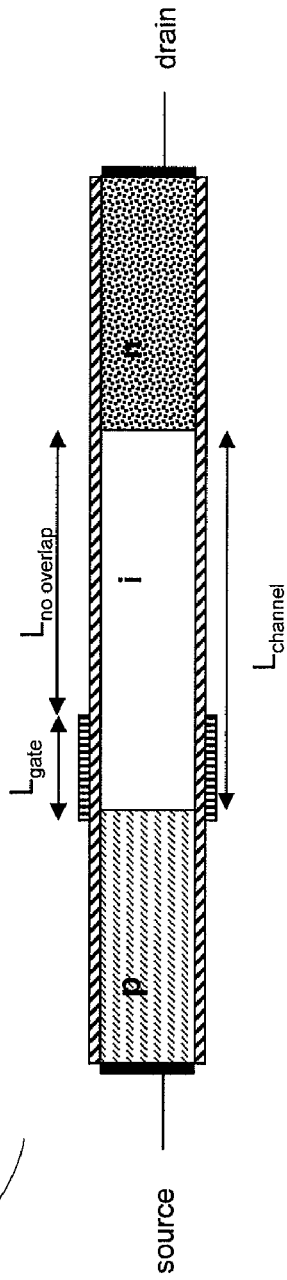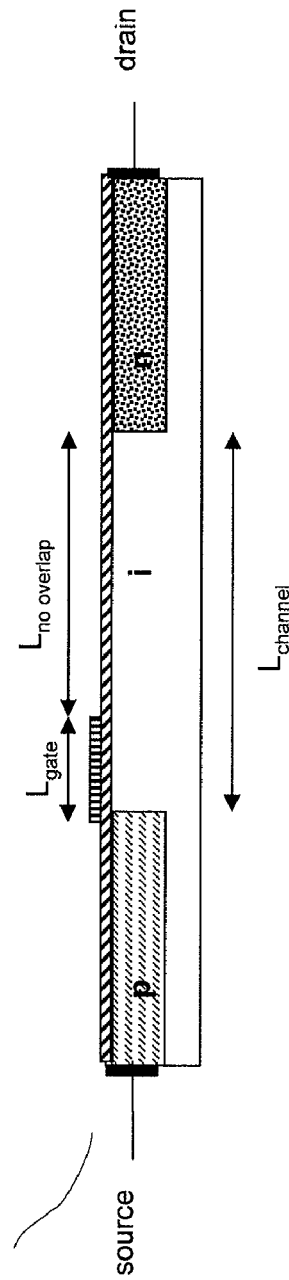

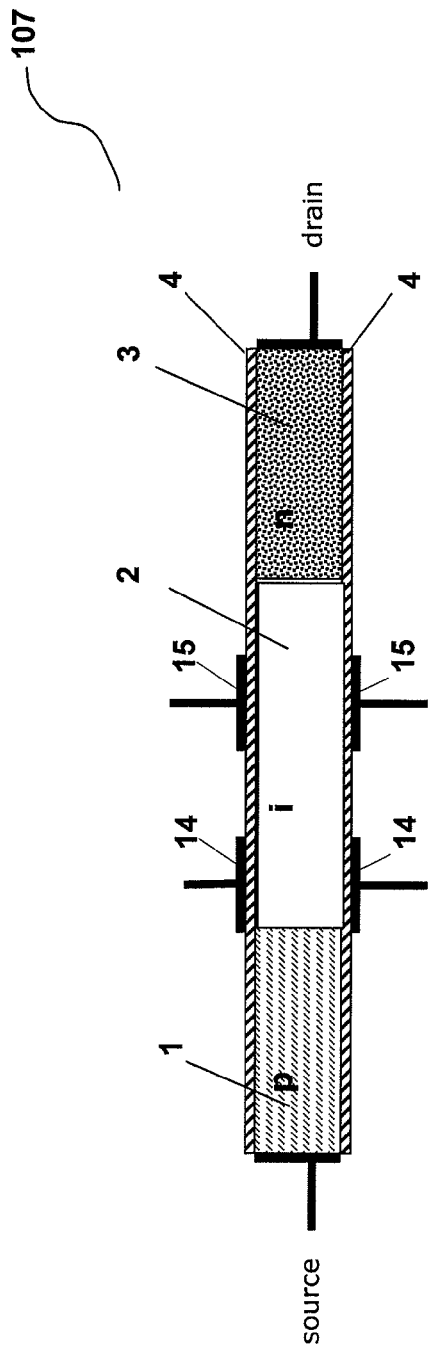
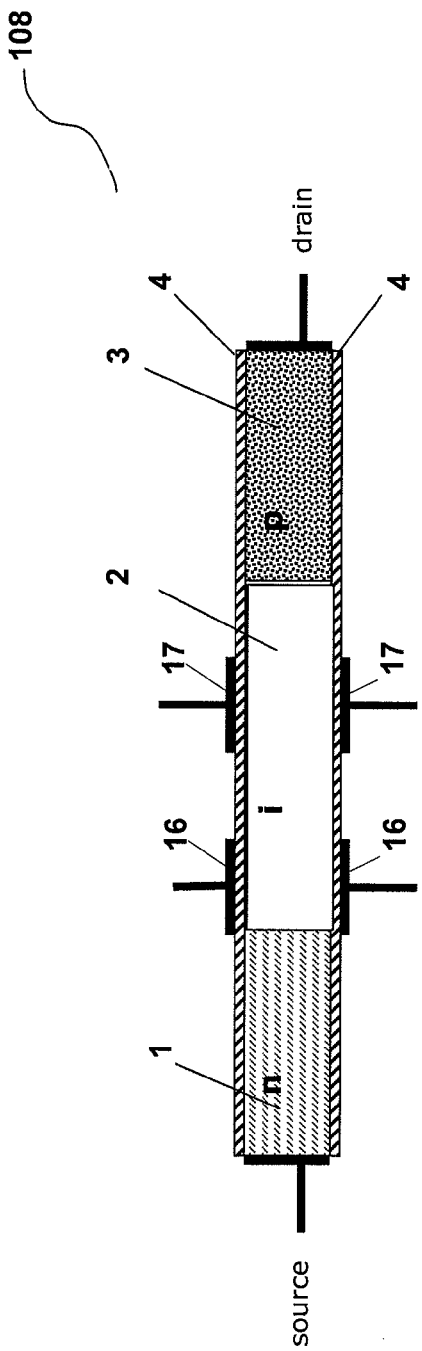

INVENTION

BACKGROUND

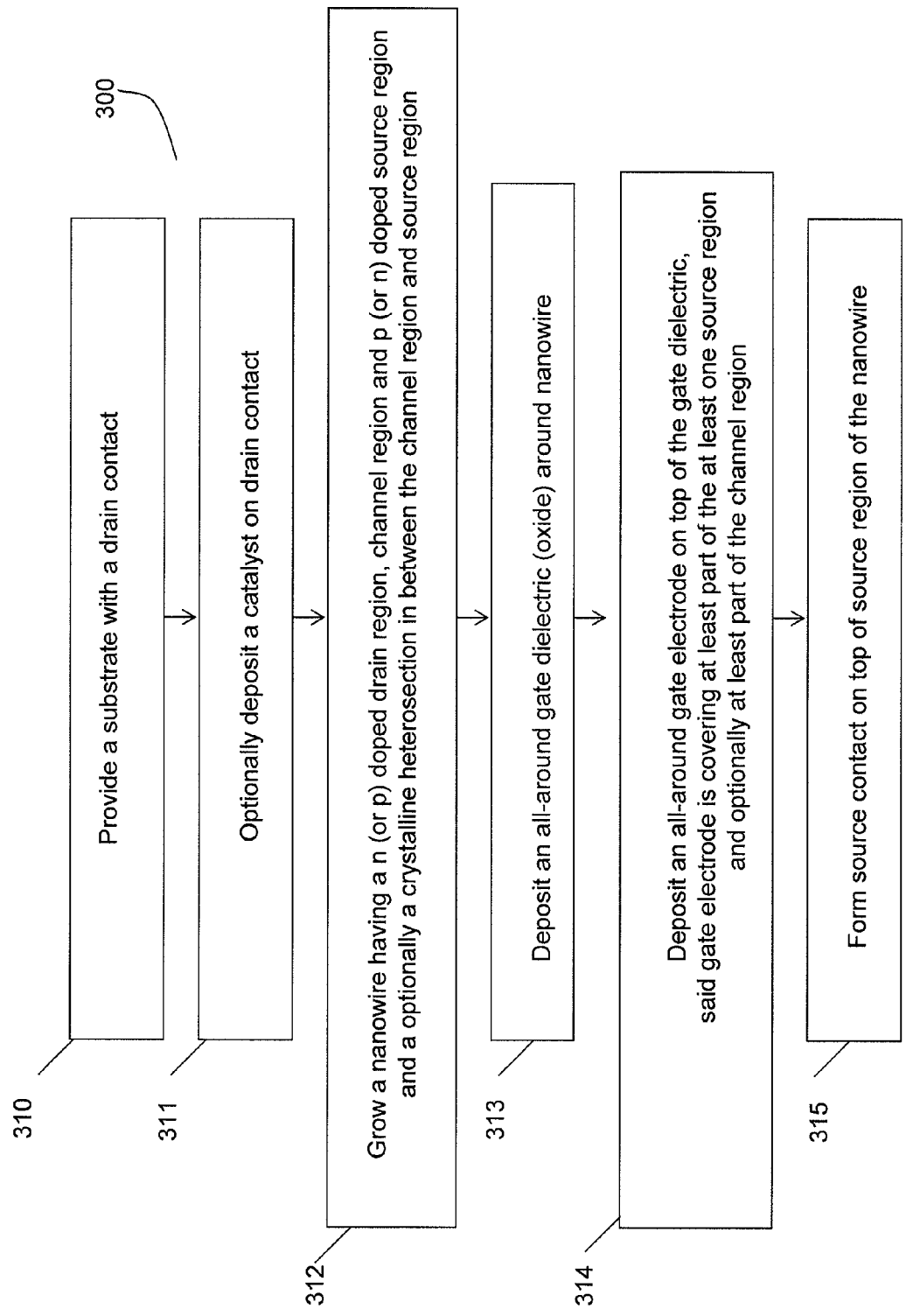

TUNNEL FIELD-EFFECT TRANSISTOR WITH GATED TUNNEL BARRIER

CROSS REFERENCE TO RELATED APPLICATIONS

This application claims priority under 35 U.S.C. §119(e) to U.S. provisional patent application 60/906,440 filed on Mar. 12, 2007, which application is hereby incorporated by reference in its entirety.

BACKGROUND OF THE INVENTION

1. Field of the Invention

The present invention is related to the field of semiconductor devices. More specifically it is related to tunnel field effect transistors (TFET) wherein the tunneling effect is band-to-band tunneling.

The invention further relates to a method of fabricating a semiconductor device, more particularly to a method for fabrication of tunnel field effect transistors (TFETs). More specifically the fabrication method relates to but is not limited to standard planar technology, double gate technology, finFET technology and nanotechnology, wherein the latter includes implementations with integrated nanowires.

2. Description of the Related Technology

Microelectronic devices are generally fabricated on semiconductor substrates as integrated circuits. A complementary metal-oxide-semiconductor (CMOS) field effect transistor (FET) is one of the core elements of such integrated circuits. Dimensions and operating voltages of CMOS transistors are continuously reduced, or scaled down, to obtain ever-higher performance and packaging density of the integrated circuits.

One of the problems due to the scaling down of CMOS transistors is that the power consumption keeps increasing. This is partly because leakage currents are increasing (e.g. due to short channel effects) and partly because it becomes difficult to decrease the supply voltage. The latter is mainly due to the fact that the subthreshold slope is limited to minimally about 60 mV/decade, such that switching the transistor from ON to OFF needs a certain voltage variation and therefore a minimum supply voltage.

Tunnel field-effect transistors (TFETs) are typically advertised as successors of metal-oxide semiconductor field-effect transistors (MOSFETs), because of their absence of short-channel effects and because of their resulting low off-currents. Another advantage of TFETs is that the subthreshold slope can be less than 60 mV/dec, the physical limit of conventional MOSFETs, such that potentially lower supply voltages can be used. However, TFETs typically suffer from low on-currents, a drawback related to the large resistance of the tunnel barrier. The low on-currents result in long gate delays (gate delay $\tau_{gate} = C_{gate} * V_{dd}/I_{ds}$, with $C_{gate}$ the gate capacitance, $V_{dd}$ the supply voltage, and $I_{ds}$ the on-current) and correspondingly slow switching speed. TFETs are also ambipolar, which means that they are turned on for both high positive and high negative gate voltages. This ambipolar behavior can result in an unwanted increase of the off-current.

In US 2005/0274992, a method of fabricating an improved TFET using nanowires is disclosed. The method comprises forming in a nanotube (i.e. a nanowire without axial opening) an n-doped region and a p-doped region that are separated by an undoped channel region of the transistor. Electrical contacts are provided for the doped regions and a gate electrode that is formed upon a gate dielectric layer is deposited on the channel region of the transistor. The proposed structure still has the disadvantage of strong ambipolar behavior.

To increase the on-current of a silicon TFET, suggestions have been made in literature by Bhuwalka et al. (IEEE transactions on electron devices Vol. 52, No 7, July 2005) to add a small (about 3 nm wide) section of highly-doped $Si_{1-x}Ge_x$ at the tunnel barrier. The $Si_{1-x}Ge_x$ has a smaller band gap than Si such that the effective tunnel barrier width decreases due to the presence of this section. However, these structures with the $Si_{1-x}Ge_x$ section can still not compete with conventional MOSFETs because of their low on-currents.

Appenzeller et al., in "Comparing Carbon Nanotube Transistors—The Ideal Choice: A Novel Tunneling Device Design" (IEEE Trans. Electron Devices, Vol. 52, pp 2568-2576 (2005)), describes a carbon nanotube based TFET, however this proposed structure still has the disadvantage of strong ambipolar behavior.

Wang et al., in "Complementary tunneling transistor for low power application" (Solid-State Electronics Vol 48, pp 2281-2286 (2004)), describes the fabrication of complementary TFETs and illustrates the low power consumption of the complementary silicon TFETs. To reduce the ambipolar behavior of the TFET, the pTFET (nTFET) has a lower p-type (n-type) doping level for the drain contact than the n-type (p-type) doping level for the source contact. This implementation has the disadvantage of an increased number of processing steps for fabrication of such devices due to the different doping levels for pTFET and nTFET. The on-current of the silicon TFETs is, furthermore, not yet comparable with the on-current of the MOSFET.

As a conclusion, there is still a need for an improved TFET design.

SUMMARY OF CERTAIN INVENTIVE ASPECTS

Certain inventive aspects relate to a good semiconductor device architecture and methods of making the same. One of its advantages is that the semiconductor device architecture can have a low power consumption. A tunnel field effect transistor (TFET) with a high switching speed and a method for the manufacturing of such semiconductor device structures are disclosed. In addition to the advantage of a high speed, (preferably an improved switching speed compared to prior art solutions), the novel TFET structure has a processing advantage, as well as a performance improvement. The processing advantage is achieved at least in part by the fact that no alignment of the gate with the drain is necessary. The performance improvement is due at least in part to the fact that the ambipolar behavior of the TFET is reduced and/or avoided.

The novel TFET structure according to embodiments of the present invention differs from traditional TFET structures because in the novel TFET structure the gate does not align with or cover the drain, and only overlaps with the source and optionally with part of the channel. Alignment of gate and drain means that the gate and drain each touch a same plane, in particular the plane of the drain-channel interface. In embodiments of the present invention, the gate may optionally overlap with part of the channel. Due to the shorter gate, compared to prior art TFETs, the total gate capacitance is reduced, which is directly reflected in an improved switching speed of the device.

Certain inventive aspects relate to the creation of a tunnel field effect transistor having a good, in embodiments of the present invention even an improved switching speed, and/or a processing advantage (no alignment of the gate with the drain is necessary), and/or a performance improvement (the ambipolar behavior of the TFET is reduced or, in embodiments of the present invention, even avoided).

Certain inventive aspects solve the problem of gate delay and hence long switching times of traditional TFET devices by introducing a new gate design, more specifically a different gate-channel overlap. The proposed structure of embodiments of the invention is in fact a traditional TFET wherein the gate does not align with or cover the drain, and only overlaps with the source and, optionally, with part of the channel. Due to the shorter gate, compared to prior art devices, the total gate capacitance is reduced, which is directly reflected in an improved switching speed of the device. The TFET structure according to one inventive aspect having a shorter gate compared to prior art devices will be further referred to as "short gate TFET".

The short gate TFET structure of embodiments of the present invention, having a shorter gate than prior art TFETs, solves problems of traditional TFET structures while still keeping the absence of short channel effects of a traditional TFET, and their resulting low off currents leading towards improved on-chip power consumption. Also the subthreshold slope can be kept lower than 60 mV/dec, the physical limit of a conventional MOSFET, such that potentially lower supply voltages can be used.

In an embodiment of the invention, the short gate TFET can comprise a nanowire (NW) structure (further referred to as a NW-TFET), the nanowire structure forming the channel region, source/drain regions and optionally a heterosection. The heterosection may be situated in between the channel region and one of the source or drain regions. The absence of gate-drain alignment or coverage in the short gate TFET may be especially attractive in the fabrication of a NW-TFET because it is leading to a more realistic processing. Whilst in planar technology, alignment of the gate with the source and drain is achieved through self-alignment of the source and drain implantations, it is not yet clear in prior art how a good alignment of the drain and source doping with the gate can be achieved in a vertical structure such as a NW-TFET. The short gate TFET according to embodiments of the present invention does not require alignment of the gate with the drain, which reduces processing constraints.

Embodiments of the invention relate to micro- and nano-electronics and may optionally be used for developing low power semiconductor device structures.

In a particular embodiment of the invention, a tunnel field effect transistor semiconductor device is disclosed. The TFET comprises at least one doped source region, at least one doped drain region and at least one channel region which is situated in between the source and drain region, the structure being referred to as source-channel-drain structure and having a longitudinal direction. The channel forms a source-channel interface with the source region and a drain-channel interface with the drain region. The TFET furthermore comprises a gate electrode which is covering at least part of the at least one source region of the source-channel-drain structure along its longitudinal direction, at least extending up to the plane of the source-channel interface, and, optionally, part of the at least one channel region such that there is a finite distance between the end of the gate electrode oriented towards the channel and the plane of the channel-drain interface, such that there is no coverage by the gate electrode (referred to as short gate) of the drain region.

In alternative embodiments of the present invention, the gate electrode is only covering at least part of the at least one source region, the coverage extending up to the plane of the interface of the source-channel region. In this embodiment, the gate electrode does not or does not substantially cover the channel.

The short gate TFET of embodiments of the present invention may further comprise a gate dielectric underneath the gate electrode, i.e. in between the source-channel-drain structure and the gate electrode, the gate dielectric covering at least part of the at least one source region extending up to the plane of the source-channel region. The gate dielectric may optionally cover part of the source, channel and/or drain regions which are not covered by the gate electrode. The gate dielectric, for example gate oxide, may be selected from at least one of silicon based oxides (e.g. silicon dioxide, silicon oxy nitride), aluminum oxide, high-k oxides (e.g. oxides, nitrided oxides, silicates and nitrided silicates of transition metals such as Hf, Ta, Ti, Nb, V, Y, Zr). In particular embodiments, the gate oxide is a high-k oxide such as hafnium oxide. The thickness of the gate dielectric, e.g. gate oxide, is preferably in the range of about 0.5 nm to 20 nm. The gate electrode may be provided upon the gate dielectric such that it is not extending beyond the gate dielectric.

In embodiments of the present invention, the gate electrode material may be made of a conductive material. The gate electrode material may be selected from at least one of poly silicon, poly germanium, metals such as Al, W, Ta, Ti, Ru, Pd, Rh, Re, Pt, and alloys thereof, metal-nitrides such as TaN and TiN, metal-silicon nitrides such as TaSiN, conductive oxides such as $RuO_2$ and $ReO_3$, fully silicided metals (FUSI) such as $CoSi_2$, NiSi and $TiSi_2$, fully germanided metals (FUGE). The gate electrode material may be chosen such that a particular gate workfunction is obtained.

The at least one source region in the short gate TFET of embodiments of the present invention may be made of a semiconductor material which is highly p doped (or n doped).

The at least one drain region in the short gate TFET of embodiments of the present invention may be made of a semiconductor material which is highly n doped (or p doped).

The doping level of the source region and drain region in the short gate TFET of some embodiments of the present invention may be in the range of about $10^{18}$/cc to $10^{21}$/cc, for example the doping level of the source region and drain region may be in the range of about $10^{19}$/cc to $5\times10^{20}$/cc.

The at least one channel region in the short gate TFET of embodiments of the present invention may be made of a semiconductor material which is lowly n doped (or p doped) and which is situated in between the source and drain region.

The doping level of the channel region in the short gate TFET of embodiments of the present invention may be in the range of undoped up to about $10^{16}$/cc, for example the doping level of the channel region may be in the range of undoped up to about $5\times10^{14}$/cc.

The length $L_{channel}$ of the channel region in the short gate TFET of some embodiments of the present invention may be in the range of about 5 nm to 50 µm, for example in the range of about 10 nm to 5 µm.

The length of the gate electrode in a NW short gate TFET according to embodiments of the present invention, or in other words the length of the short gate (referred to as $L_{gate}$) may be between about 1 nm and 50 µm, for example between about 5 nm and 5 µm.

According to embodiments of the present invention, the length of the channel region which is not covered by a gate electrode (referred to as $L_{no\ overlap}$) may be in the range of about 1 nm up to the whole length of the channel region (no overlap wherein the gate electrode only covers the source region), for example in the range of 5 nm up to the whole length of the channel region.

In the short gate TFET of embodiments of the present invention, the overall semiconductor material, i.e. the basic material from which the source, channel and drain are formed may be selected from at least one of group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof, or carbon nanotubes.

According to a particular embodiment, the short gate TFET may be a NW-TFET which further comprises a heterosection. The heterosection may be made of a semiconductor material (referred to as heterosection material) which is different from the overall semiconductor material of the short gate TFET. The heterosection may be highly doped and may be situated in between the source region (or drain region) and the channel region. Alternatively, the heterosection can be made of a metal such as Al, W, Ta, Ti, Ru, Pd, Rh, Re, Pt, or alloys thereof, a silicide, a germanide, a metal-nitride such as TaN and TiN, a conductive oxide such as $RuO_2$ and $ReO_2$, a silicided metal such as $CoSi_2$, $NiSi_2$, a metal germanide and/or alloys and mixtures thereof. The heterosection (semiconductor) material in the short gate NW-TFET of embodiments of the present invention may have interfaces with reduced number of defects, e.g. defect free interfaces (such as e.g. avoiding dislocations during growth), to the overall semiconductor material. It may be made of a material that has a lattice constant which is different from the lattice constant of the overall semiconductor material of the short gate TFET. The heterosection semiconductor material may be selected from at least one of group IV materials such as Si, Ge, C or binary compounds thereof, or group III/V materials such as In, Ga, As, Sb, Al, P, B, N or binary, tertiary or quaternary compounds thereof or group II/VI materials such as Cd, Zn, S, Se, Te, O or binary, tertiary or quaternary compounds thereof. The heterosection semiconductor material may be germanium or $Si_{1-x}Ge_x$ with $x>0.5$. The short gate of the short gate NW-TFET may be covering at least part of the at least one source region of the source-channel-drain structure along its longitudinal direction, extending at least up to the plane of the source-channel interface, and, optionally, part of the at least one channel region such that there is a finite distance between the end of the gate electrode oriented towards the channel and the plane of the channel-drain interface such that there is no coverage of the drain region by the gate electrode (referred to as short gate). Alternatively, the gate electrode may be only covering at least part of the at least one source region, the coverage extending up to the plane of the source-channel interface.

The short gate TFET of some embodiments of the present invention may further comprise an electrical contact to each of the source regions and drain regions. The electrical contact on each of the source regions and drain regions may be a conductive material which may be selected from at least one of a silicide containing structure ($NiSi$, $CoSi_2$, $TiSi_2$, . . . ), a germanide containing structure, a metal containing structure, poly silicon or a combination thereof. The electrical contact on each of the source regions and drain regions may be a combination of a metal with a silicide.

According to a particular embodiment of the invention the source-channel-drain structure may be a planar structure. In these embodiments, the gate electrode (referred to as short gate) in the short gate TFET may be a single gate structure situated on top of the planar source-channel-drain structure.

According to another embodiment of the invention the source-channel-drain structure may be a horizontal structure and the gate electrode (short gate) may be a double gate structure situated on the sidewalls of the horizontal source-channel-drain structure.

According to another embodiment of the invention the short gate TFET may be a triple-gate FET (e.g. FinFET). In these embodiments, the gate electrode may be a triple gate structure situated on the sidewalls and on top of the source-channel-drain structure of the triple-gate FET.

According to yet another embodiment of the invention the source-channel-drain structure may be a horizontal or vertical structure. In these embodiments, the gate electrode (short gate) may be an all-around gate structure around the horizontal or vertical source-channel-drain structure.

According to embodiments of the invention, the short gate TFET may comprise a NW. The diameter of the NW, perpendicular to its longitudinal axis, may be in the range of about 1 nm up to 500 nm, for example the diameter of the NW may be between about 2 and 200 nm. The length of the NW, along its longitudinal axis used may be in the range of about 5 nm and 50 μm, for example the length of the NW used in the short gate TFET may be between about 10 nm and 5 μm.

According to embodiments of the invention, the short gate TFET may be a NW-TFET which comprises a heterosection. The length of the heterosection may be in the range of about 1 nm and 50 nm, for example the length of the heterosection may be between about 2 nm and 10 nm. The doping level of the heterosection in the short gate TFET of one embodiment may be in the range of about $10^{18}$/cc to $10^{21}$/cc, for example the doping level of the heterosection may be in the range of about $10^{19}$/cc to $5\times10^{20}$/cc.

According to a particular embodiment of the invention, the short gate TFET may further comprise a second gate on the remainder of the channel. This second gate may cover part of the channel region. The electrical equivalent circuit thereof is a TFET in series with a MOSFET. The second gate structure can be a single gate structure, a double gate structure, a triple gate structure or an all-around gate structure depending on the type of TFET (planar, FinFET, NW-TFET, . . . ) as described above in embodiments of the invention.

Furthermore a method for manufacturing a TFET semiconductor device, called short gate TFET, is disclosed wherein the method comprises:
  providing on a substrate a source-channel-drain structure made of a semiconductor material, the structure having at least one drain region, at least one channel region, and at least one source region, there being a source-channel interface and a drain-channel interface,
  providing on the source-channel-drain structure a gate electrode, the gate electrode covering at least part of the at least one source region of the source-channel-drain structure along its longitudinal direction and extending at least up to the plane of the source-channel interface, and, optionally, part of the at least one channel region, such that there is a finite distance between the end of the gate electrode oriented towards the channel and the plane of the channel-drain interface such that there is no coverage of the drain region by the gate electrode.

According to embodiments of the present invention, source and drain contacts may be provided. Furthermore, the source, drain and/or channel regions may be doped with a desired dopant type to a desired doping level.

In alternative embodiments, a method according to embodiments of the present invention may comprise:
  providing on a substrate at least one drain contact
  providing on the drain contact a source-channel-drain structure made of a semiconductor material, the structure having at least one drain region, at least one channel region, and at least one source region, there being a source-channel interface and a drain-channel interface, selectively doping the at least one drain region, at least one channel region, and at least one source region to a desired doping level and dopant type, providing on the source-channel-drain structure a gate dielectric, e.g. an oxide, and a gate electrode, the gate dielectric covering along the longitudinal direction at least part of the source-channel-drain structure and the gate electrode being situated on the gate dielectric, not extending beyond the gate dielectric and covering at least part of the at least one source region of the source-channel-drain structure along the longitudinal direction thereof, and extending at least up to the plane of the source-channel interface, and, optionally, covering part of the at least one channel region, such that there is a finite distance between the end of the gate electrode oriented towards the channel and the plane of the channel-drain interface such that there is no coverage of the drain region by the gate electrode, and forming at least one source contact on the at least one source region.

Furthermore a method for manufacturing a short gate NW-TFET semiconductor device is disclosed. The method comprises:

providing on a substrate at least one drain contact onto which optionally a catalyst is deposited, growing a nanowire structure made of a semiconductor material, the nanowire having an integrated drain region, a channel region, and a source region, there being a source-channel interface and a drain-channel interface, optionally doping (selectively) the source region, channel region and drain region to a desired doping level and dopant type, depositing at least partly on the side walls of the nanowire a gate dielectric (e.g. oxide), depositing on top of the gate dielectric (e.g. oxide) a gate electrode, the gate electrode being situated on the gate dielectric so as to not extend beyond the gate dielectric, the gate electrode covering at least part of the at least one source region of the source-channel-drain structure along the longitudinal direction thereof and extending at least up to the plane of the source-channel interface, and, optionally, part of the at least one channel region, such that there is a finite distance between the end of the gate electrode oriented towards the channel and the plane of the channel-drain interface such that there is no coverage by the gate electrode (referred to as short gate) of the drain region, forming a source contact on top of the source region of the nanowire.

For the application in tunnel field-effect-transistor devices the nanowire in a short gate NW-TFET may form the channel and potentially also the source and drain regions of the tunnel field-effect transistor. Alternatively, either the source or drain regions of the tunnel field-effect transistor are situated in the substrate whereby the substrate comprises highly doped regions acting as source and drain regions.

Furthermore a method for manufacturing a short gate NW-TFET semiconductor device comprising a heterosection is disclosed whereby the method comprises:

providing on a substrate at least one drain contact, onto which optionally a catalyst is deposited growing a nanowire structure, the nanowire having an integrated drain region, a channel region and a source region whereby the source region, channel region and drain region are made of a semiconductor material and the channel region further comprises an integrated heterosection which is made of a different (heterosection) semiconducting material having a different lattice constant, there being a source-channel interface and a drain-channel interface, selectively doping the source region, channel region, heterosection and drain region to the desired doping level and dopant type.

depositing at least partly on the side walls of the nanowire a gate dielectric (e.g. oxide)

depositing on top of the gate dielectric (oxide) a gate electrode, the gate electrode being situated on the gate dielectric so as to not extend beyond the gate dielectric, the gate electrode covering at least part of the at least one source region of the source-channel-drain structure along the longitudinal direction thereof and part of the at least one channel region such that there is a finite distance between the end of the gate electrode coverage towards the channel and the plane of the channel-drain interface such that there is no coverage by the gate electrode (referred to as short gate) of the drain region.

forming a source contact on top of the source region of the nanowire.

In a particular embodiment, the substrate used for manufacturing a NW-TFET may be a Si wafer.

In a particular embodiment the length of the channel region (referred to as $L_{channel}$) is in the range of about 5 nm to 50 µm, for example in the range of about 10 nm to 5 µm.

In a particular embodiment the length of the gate electrode in the (NW) short gate TFET, or in other words the length of the short gate (referred to as $L_{gate}$) is between about 1 nm and 50 µm, e.g. between about 5 nm and 5 µm.

In a particular embodiment the length of the channel region which is not covered by a gate electrode (referred to as $L_{no\ overlap}$) is in the range of 1 nm up to the whole length of the channel region (no overlap wherein the gate electrode only covers the source region), for example $L_{no\ overlap}$ may be in the range of about 5 nm up to the whole length of the channel region.

In a particular embodiment the doping level of the source region and drain region is in the range of about $10^{18}$/cc to $10^{21}$/cc, for example the doping level of the source region and drain region may be in the range of about $10^{19}$/cc to $5 \times 10^{20}$/cc.

In a particular embodiment the doping level of the channel region is in the range of undoped up to $10^{16}$/cc doping, for example the doping level of the channel region may be in the range of undoped up to $5 \times 10^{14}$/cc doping.

In a particular embodiment, the (overall) semiconductor material is selected from at least one of group IV materials such as Si, Ge, C or binary compounds thereof, or group III/V materials such as In, Ga, As, Sb, Al, P, B, N or binary, tertiary or quaternary compounds thereof or group II/VI materials such as Cd, Zn, S, Se, Te, O or binary, tertiary or quaternary compounds thereof, or carbon nanotubes.

In a particular embodiment, the heterosection is made of a different semiconductor material (different compared to the overall semiconducting material), whereby the heterosection semiconductor material is such that it has a different lattice constant than the overall semiconductor material (e.g. of the nanowire).

In a particular embodiment, the heterosection semiconductor material may be selected from at least one of the group IV materials such as Si, Ge, C or binary compounds thereof, or group III/V materials such as In, Ga, As, Sb, Al, P, B, N or binary, tertiary or quaternary compounds thereof or group II/VI materials such as Cd, Zn, S, Se, Te, O or binary, tertiary or quaternary compounds thereof. In particular embodiments the heterosection semiconductor material may be germanium or $Si_{1-x}Ge_x$ with x>0.5.

Alternatively, the heterosection can be made of metals (Al, W, Ta, Ti, Ru, Pd, Rh, Re, Pt, or alloys thereof), suicides, germanides, metal-nitrides such as TaN and TiN, conductive oxides such as $RuO_2$ and $ReO_2$, silicided metals such as $CoSi_2$, $NiSi_2$, metal germanides or alloys or mixtures thereof.

In a particular embodiment the length of the heterosection in the short gate NW-TFET device comprising a heterosection is in the range of about 1 nm up to 50 nm, for example the length of the heterosection may be in the range of about 2 nm to 10 nm.

In a particular embodiment the doping level of the heterosection is in the range of about $10^{18}$/cc to $10^{21}$/cc, for example the doping level of the heterosection may be in the range of about $10^{19}$/cc to $5 \times 10^{20}$/cc.

In a particular embodiment the diameter of the nanowire in the NW short gate TFET is between about 1 and 500 nm, for example the diameter of the nanowire may be between about 2 and 200 nm. The length of the nanowire in the NW short gate TFET may be between about 5 nm and 50 μm, for example the length of the nanowire may be between about 10 nm and 5 μm.

In a particular embodiment the gate dielectric may be an oxide, for example an oxide selected from at least one of silicon based oxides (e.g. silicon dioxide, silicon oxy nitride), aluminum oxide, high-k oxides (oxides, nitrided oxides, silicates and nitrided silicates of transition metals such as Hf, Ta, Ti, Nb, V, Y, Zr). In particular embodiments, the gate oxide may be a high-k oxide such as hafnium oxide.

In a particular embodiment the gate electrode may be made of a conductive material. Such conductive material may be selected from at least one of poly silicon, poly germanium, metals such as Al, W, Ta, Ti, Ru, Pd, Rh, Re, Pt, or alloys thereof, metal-nitrides such as TaN and TiN, metal-silicon nitrides such as TaSiN, conductive oxides such as $RuO_2$ or $ReO_3$, fully silicided metals (FUSI) such as $CoSi_2$, NiSi and $TiSi_2$, fully germanided metals (FUGE), workfunction tunable metals, engineered materials to obtain a particular gate workfunction.

In a particular embodiment the gate electrode may be made of a metal of which the workfunction has been engineered specifically for the chosen channel material and doping.

In a particular embodiment the source and drain contact may be made of a conductive material which is selected from at least one of a silicide containing structure (NiSi, $CoSi_2$, $TiSi_2$, . . . ), a germanide containing structure, a metal containing structure, poly silicon or a combination thereof. The source and drain may be a combination of a metal with a silicide.

The concept of the short gate TFET of embodiments of the present invention and other characteristics, features and advantages of the present invention are applicable to all types of TFET implementations, including but not limited to planar TFETs, double-gate TFETs, tri-gate TFETs (like FinFETs), and all-around TFETs, including but not limited to all horizontal and all vertical TFET implementations, including both implementations with a bulk contact and without a bulk contact.

The concept of the short gate TFET of embodiments of the present invention and other characteristics, features and advantages of the present invention are furthermore applicable to all TFETs independent of the channel doping, including both p-type channel doping, n-type channel doping and intrinsic doping.

The concept of the short gate TFET of embodiments of the present invention and other characteristics, features and advantages of the present invention are furthermore applicable to all TFET implementations, independent of the semiconductor material used as source material, as channel material, and as drain material, including TFETs with a source material which is different from the channel material and/or which is different from the drain material, including TFETs with a drain material which is different from the channel material. Possible semiconducting materials are including but not limited to group IV materials such as Si, Ge, C or binary compounds thereof, or group III/V materials such as In, Ga, As, Sb, Al, P, B, N or binary, tertiary or quaternary compounds thereof or group II/VI materials such as Cd, Zn, S, Se, Te, O or binary, tertiary or quaternary compounds thereof, or carbon nanotubes.

The concept of the short gate TFET of embodiments of the present invention and other characteristics, features and advantages of the present invention are furthermore applicable to all TFET implementations, independent of the gate dielectric material and thickness. Possible gate dielectric materials are including but not limited to silicon based oxides (e.g. silicon dioxide, silicon oxy nitride), aluminum oxide, high-k oxides (oxides, nitrided oxides, silicates and nitrided silicates of transition metals such as Hf, Ta, Ti, Nb, V, Y, Zr).

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

FIG. 1 (PRIOR ART) shows a cross section of a traditional TFET structure whereby the gate overlaps with the whole of the channel region, including a small overlap with both the source and drain regions of the TFET structure;

FIG. 2A illustrates a cross-section of the TFET structure according to an embodiment of the invention whereby the gate does not align with or cover the drain, and only overlaps with part of the source and part of the channel. FIG. 2B illustrates the fact that the TFET structure according to embodiments of the present invention (as shown in FIG. 2A) can be approximated by a pn tunnel diode which is coupled in series with a n-i-n resistor;

FIG. 8A illustrates a cross section of a double gate TFET structure according to embodiments of the present invention versus a cross section of a single gate TFET structure (FIG. 8B) according to embodiments of the present invention (according to planar technology);

FIG. 9A illustrates a cross section of a (double) short gate TFET structure (acting as an n-TFET) according to an embodiment of the present invention, having a second (short) gate structure on the remainder of the channel which covers only part of the channel region. FIG. 9B illustrates the complementary structure (acting as a p-TFET) of FIG. 9A, according to an embodiment of the present invention;

FIG. 12 illustrates a flowchart of a processing method according to embodiments of the present invention to fabricate a short gate NW-TFET.

DETAILED DESCRIPTION OF CERTAIN INVENTIVE EMBODIMENTS

Figure 3:
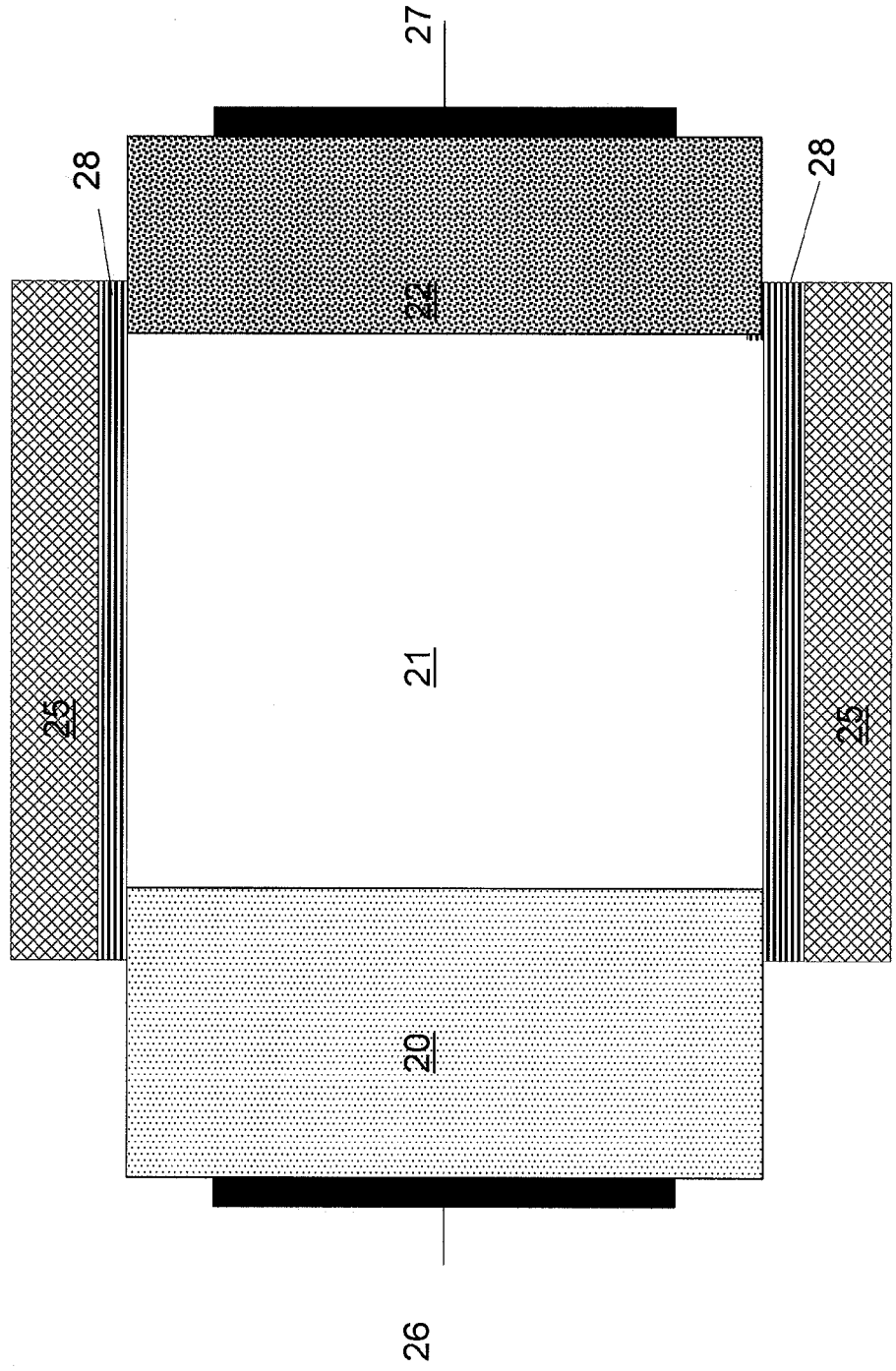
FIG. 3 (PRIOR ART) illustrates a more detailed cross section of a traditional TFET structure whereby the gate overlaps the whole channel region including a small overlap with both the source and drain regions of the TFET structure.

Embodiments of the present invention will be described with respect to particular embodiments and with reference to certain drawings but the invention is not limited thereto but only by the claims. The drawings described are only schematic and are non-limiting. In the drawings, the size of some of the elements may be exaggerated and not drawn to scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Furthermore a tunnel field-effect transistor can be defined as a gated p-i-n diode, whereby the diode is reverse biased, and whereby the gate action controls the band-to-band Zener tunneling current through the device (see also reference "Physics of semiconductor devices", S. M. Sze, John Wiley & Sons (1981).

Moreover, the term double-gate structure refers to a double gate structure consisting of two gates situated on opposite sidewalls of a horizontal source-channel-drain structure. A triple gate refers to a triple gate structure consisting of one gate situated on the sidewalls and on top of a horizontal source-channel-drain structure.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

Whenever reference is made hereinafter to a particular dopant type, this is done for the ease of explanation only and is not intended to limit the invention. It is to be understood that in the examples given herein below, materials and dopant types may be replaced by other suitable materials and dopant types, without changing the invention.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising components A and B" should not be limited to devices consisting only of components A and B. It means that with respect to the present invention, the only relevant components of the device are A and B.

It is further to be noticed that the term "short gate" refers to the gate electrode and not implicitly to the whole gate structure comprising the gate electrode and gate dielectric. In embodiments of the present invention, the gate dielectric is situated at least underneath the whole gate electrode but can furthermore cover the whole channel and optional source and drain region without altering (changing) the objectives of the invention.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

Certain embodiments of the present invention are concerned with the problem of too low ON currents and ambipolar behavior in existing tunnel field effect transistors (TFET). Embodiments of the invention propose a different gate design such that the TFET has a much reduced (or even no) ambipolar behavior (leading towards reduced off-currents and therefore reduced power consumption) and a reduced capacity (leading towards higher switching rates). More specifically, according to embodiments of the present invention a new gate electrode design is disclosed whereby the gate does not overlap with the drain region of the TFET, the new TFET design having a shorter gate electrode structure than prior art designs, which new structure is referred to as short gate TFET. Furthermore a heterosection can be (optionally) introduced in the channel region of the short gate TFET. The heterosection is then situated in between the channel region and the source (or drain) region of the TFET and will increase the on current of the TFET.

In a first aspect of the invention, a novel TFET device is disclosed having a new gate electrode design, more specifically a novel gate (electrode) design whereby the gate does not align with or cover the drain, and only overlaps with the source and, optionally, part of the channel. The novel TFET is further described below according to embodiments of the invention and referred to in general as a short gate TFET.

FIG. 1 illustrates a cross section of a traditional TFET structure 100 whereby the gate 5 overlaps with the whole channel region 2 including a small overlap with both the source 1 and drain 3 regions of the TFET structure. The TFET structure as illustrated in FIG. 1 further comprises a gate dielectric 4, at least between the source-channel-drain structure and the gate electrode 5. FIG. 3 illustrates a more detailed cross section of a traditional TFET structure whereby the gate structure (comprising a gate electrode 25 and gate dielectric 28) overlaps with the whole channel region 21 including a small overlap with both the source 20 and drain 22 regions of the TFET structure. The TFET structure as illustrated in FIG. 3 further comprises a source contact 26, a drain contact 27 and a gate dielectric 28 underneath the gate electrode 25.

FIG. 2A illustrates a cross-section of the short gate TFET structure 101 according to an embodiment of the invention whereby at least the gate electrode 6 does not align or overlap with the drain 3, and only overlaps with the source 1 and, in the embodiment illustrated, with part of the channel 2. The short gate TFET structure 101 as illustrated in FIG. 2A further comprises a gate dielectric 4. FIG. 2B illustrates the fact that the short gate TFET structure according to embodiments of the present invention (for example the embodiment as shown in FIG. 2A) can be approximated by a pn tunnel diode 102 which is coupled in series with a n-i-n resistor 103.

Figure 4:
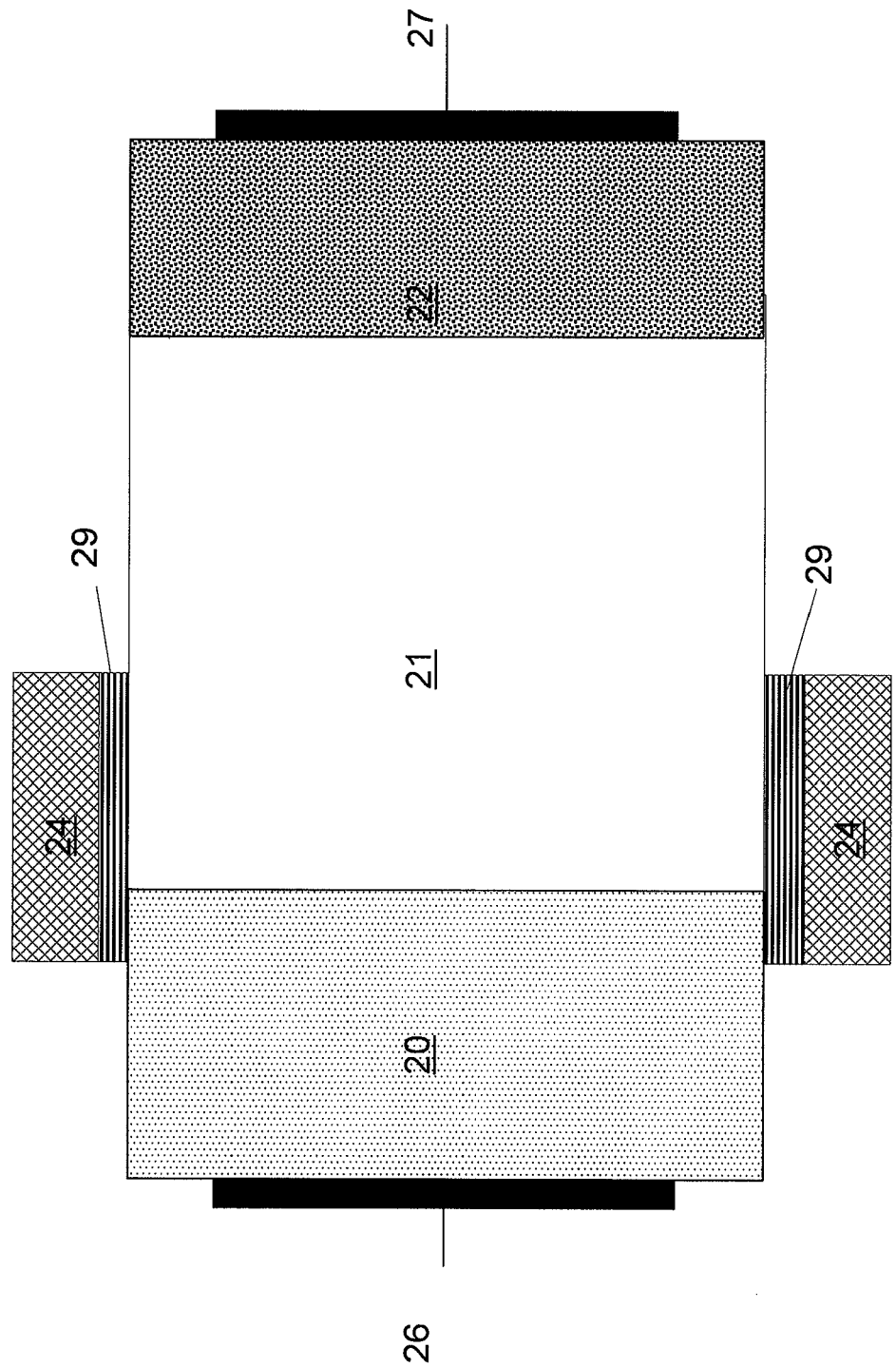
FIG. 4 illustrates a more detailed cross section of the TFET structure according to an embodiment of the invention whereby the gate does not align with or cover the drain, and only overlaps with part of the source and, in the embodiment illustrated, with part of the channel.

FIG. 4 illustrates a more detailed cross section of the short gate TFET structure according to an embodiment of the invention whereby the gate does not align or overlap with the drain, and only overlaps with the source and, in the embodiment illustrated, with part of the channel. The short gate TFET comprises at least one doped source region 20, at least one doped drain region 22, and at least one channel region 21 which is situated in between the source 20 and drain 22 region, thus forming a source-channel interface and a drain-channel interface. The short gate TFET furthermore comprises a gate electrode 24 covering at least part of the at least one source 20 region and at least extending up to the plane of the source-channel region, and optionally covering part of the at least one channel 21 region such that there is a finite distance between the end of the gate electrode 24 coverage of the channel and the plane of the channel-drain interface, such that there is no coverage by the gate electrode 24 (short gate) of the drain region 22. The short gate TFET structure as illustrated in FIG. 4 further comprises a gate dielectric 29 underneath the gate electrode 24 (short gate). The gate dielectric is at least situated along the whole length of the gate electrode but can cover the whole length of the TFET structure. The short gate TFET structure in FIG. 4 further comprises a source contact 26 and drain contact 27.

The short gate TFET of embodiments of the present invention can comprise a nanowire (NW) structure (further referred to as a NW-TFET), the nanowire at least comprising the channel region, either one or both of source and drain regions and optionally a heterosection.

The short gate TFET of embodiments of the present invention is applicable to all TFET implementations, including but not limited to a planar TFET, a double-gate TFETs, a tri-gate TFET (like FINFET), and an all-around TFET, including but not limited to all horizontal and all vertical TFET implementations, including both implementations with a bulk contact and without a bulk contact. The bulk contact can be defined as a highly doped region situated in the substrate According to an embodiment of the invention, the short gate TFET can be a single gate TFET structure 106 (FIG. 8B) referring to a planar TFET structure whereby the source, channel and drain regions are situated in a substrate and whereby the (short) gate is situated at least partly on top of the source region, extending up to the plane of the interface of the source-channel region and, optionally and as illustrated in FIG. 8B, further extending on top of the channel region but not extending on the drain region. An example of such a short gate TFET having a single (short) gate is illustrated in FIG. 8B.

Alternatively, the short gate TFET of embodiments of the invention can be a double gate TFET structure 105 (FIG. 8A). The (short) gate is situated at least partly on the sidewalls of the source region, extending up to the plane of the interface of the source-channel region and, optionally and as illustrated in FIG. 8A, further extending on the sidewalls of the channel region but not extending on the sidewalls of the drain region. An example of such a short gate TFET having a double (short) gate is illustrated in FIG. 8A.

Both FIGS. 8A and 8B illustrate clearly that the short gate electrode (indicated as $L_{gate}$) in accordance with embodiments of the present invention covers at most part of the whole channel length (indicated as $L_{channel}$), such that there is still a part of the channel left which is not covered by the short gate (electrode) structure (indicated as $L_{no\ overlap}$). The length of the channel region ($L_{channel}$) may for example be in the range of about 5 nm to 50 µm, for example in the range of about 10 nm to 5 µm. The length of the gate electrode in the short gate TFET ($L_{gate}$) may for example be between about 1 nm and 50 µm, e.g. between about 5 nm and 5 µm. The length of the channel region which is not covered by a gate electrode ($L_{no\ overlap}$) may for example be in the range of about 1 nm up to the whole length of the channel region (no overlap wherein the gate electrode only covers the source region), such as e.g. in the range of about 5 nm up to the whole length of the channel region.

Figure 7:
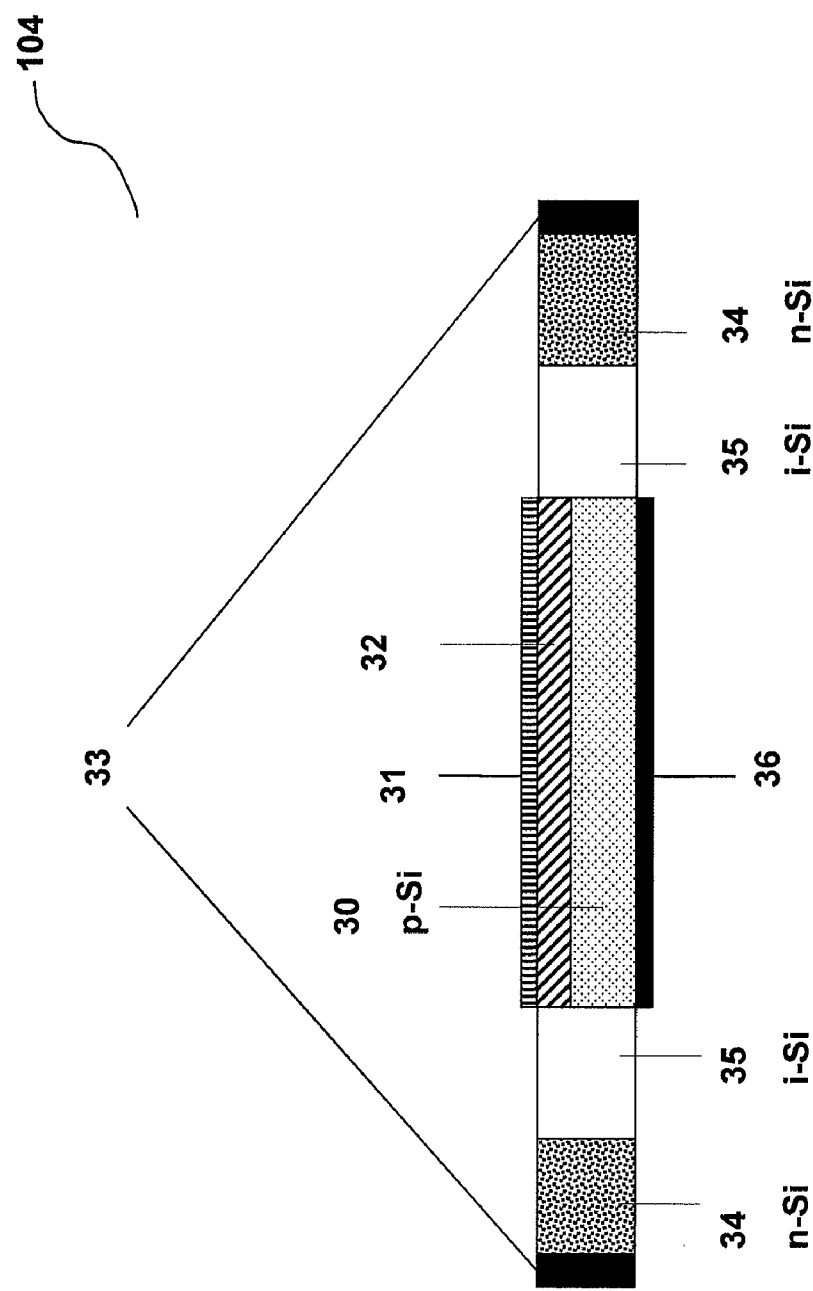
FIG. 7 illustrates an alternative cross section of the TFET structure of embodiments of the present invention having two channel regions and two drain sections and whereby the gate only overlaps with the source section and not with the channel region.

FIG. 7 illustrates an alternative cross section of a TFET structure according to embodiments of the present invention, having two channel regions 35 and two drain sections 34, and whereby the gate (electrode 31+gate dielectric 32) only overlaps with the source section 30 and not with the channel region(s) 35. The structure further comprises a source contact 36 and two drain contacts 33.

In yet another alternative, the short gate TFET of embodiments of the invention may comprise a tri (triple) gate structure in analogy with multiple gate FET devices (e.g. FinFET devices) whereby the (short) gate is situated at least partly on the top and the sidewalls of the at least one source region extending up to the plane of the interface of the source-channel region and, optionally, on the top and the sidewalls of the channel region, but not on the top and sidewalls of the at least one drain region.

According to a (yet another) embodiment of the invention, the short gate TFET structure may be an all-around gate structure which is especially attractive in vertical devices such as a vertical NW-TFET. The all-around short gate is situated at least partly around the at least one source region, extending up to the plane of the interface of the source-channel region and optionally around the at least one channel region, but not around the at least one drain region.

The short gate TFET of embodiments of the present invention is further applicable to all TFET implementations independent of the channel doping, including both p-type channel doping, n-type channel doping and intrinsic doping.

The short gate TFET of embodiments of the present invention is further applicable to all TFET implementations independent of the semiconductor material used as source material, as channel material, and as drain material, including a TFET with a source material which is different from the channel material and/or which is different from the drain material, including TFETs with a drain material which is different from the channel material. Possible semiconducting materials are including but not limited to group IV materials such as Si, Ge, C or binary compounds thereof, or group III/V materials such as In, Ga, As, Sb, Al, P, B, N or binary, tertiary or quaternary compounds thereof or group II/VI materials such as Cd, Zn, S, Se, Te, O or binary, tertiary or quaternary compounds thereof, or carbon nanotubes.

The short gate TFET of embodiments of the present invention is further applicable to all TFET implementations independent of the gate dielectric material and thickness. Possible gate materials are including but not limited to silicon based oxides (e.g. silicon dioxide, silicon oxy nitride), aluminum oxide, high-k oxides (oxides, nitrided oxides, silicates and nitrided silicates of transition metals such as Hf, Ta, Ti, Nb, V, Y, Zr).

According to an embodiment of the invention, the short gate TFET can have an additional gate structure. The uncovered part of the channel ($L_{no\ overlap}$) offers the possibility to incorporate a second gate structure. The second gate structure can be a single or double gate (in similarity to FIGS. 8A and 8B).

FIG. 9A illustrates a cross section of a (double) short gate n-TFET structure having a second (short) gate structure 107 on the remainder of the channel, in accordance with embodiments of the present invention. The additional (short) gate covers only part of the channel region, and does not cover the drain region. The first gate 14 (covering the source 1 and, optionally, part of the channel) turns on or off the tunnel barrier, the second gate 15 opens or closes the channel as happens in a traditional MOSFET. The gate dielectric underneath both gates can cover the whole length of the short gate TFET structure. The device is off when either the first gate 14 is in the off position or when the second gate 15 is in the off position. The device is on when both gates 14, 15 are in the on position. The logic function implemented by this device is ((gate 1) AND (gate 2)). The electrical equivalent circuit is a TFET in series with a MOSFET. FIG. 9B illustrates the complementary structure 108 of FIG. 9A whereby the source region 1 is highly n-doped and the drain region 3 is highly p-doped to realize a p-TFET.

According to embodiments of the invention, the short gate TFET comprises a NW. The diameter of the NW, perpendicular to its longitudinal axis, may be in the range of about 1 nm up to 500 nm, for example between about 2 and 200 nm. The length of the NW, along its longitudinal axis may be in the range of about 5 nm to 50 µm, for example between about 10 nm and 5 µm.

Figure 10B:
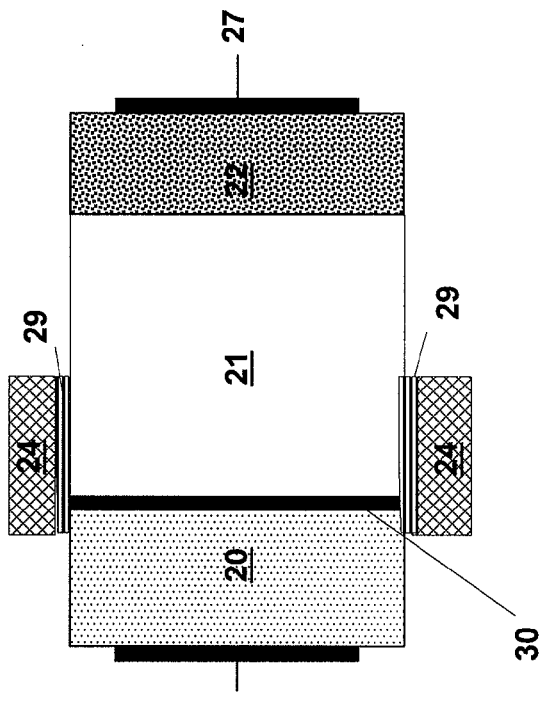
FIG. 10B illustrates a cross section of a short gate NW-TFET according to an embodiment of the invention.
Figure 10A:
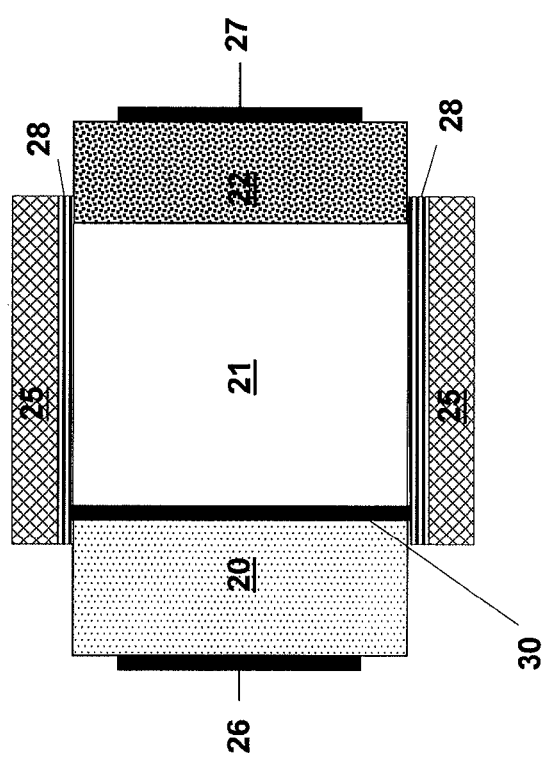
FIG. 10A illustrates a cross-section of a NW-TFET structure.

According to an embodiment, the short gate TFET may be a NW-TFET which further comprises a heterosection. FIG. 10A illustrates a cross-section of a prior art NW-TFET structure having a heterosection 30 and FIG. 10B illustrates a cross section of a short gate NW-TFET having a heterosection 30 according to embodiments of the invention. The heterosection may be made of a semiconductor material (referred to as heterosection material) which is different from the overall semiconductor material, i.e. the source-channel-drain material of the short gate TFET. The heterosection may be highly doped and may be situated in between the source region (or drain region) and the channel region. Alternatively, the heterosection can be made of a metal such as Al, W, Ta, Ti, Ru, Pd, Rh, Re, Pt, or alloys thereof, a silicide, a germanide, a metal-nitride such as TaN and TiN, a conductive oxide such as $RuO_2$ and $ReO_2$, a silicided metal such as $CoSi_2$, $NiSi_2$, a metal germanide and/or alloys and mixtures thereof. The heterosection (semiconductor) material in the short gate NW-TFET of embodiments of the present invention has defect free interfaces to the overall semiconductor material and may be made of a material that has a lattice constant which is different from the lattice constant of the overall semiconductor material, i.e. the source-channel-drain material of the short gate TFET. The heterosection semiconductor material may be selected from at least one of group IV materials such as Si, Ge, C or binary compounds thereof, or group III/V materials such as In, Ga, As, Sb, Al, P, B, N or binary, tertiary or quaternary compounds thereof or group II/VI materials such as Cd, Zn, S, Se, Te, O or binary, tertiary or quaternary compounds thereof. In particular embodiments, the heterosection semiconductor material may be germanium or $Si_{1-x}Ge_x$ with x>0.5. The short gate of the short gate NW-TFET is covering at least part of the at least one source region, extending up to the plane of the interface of the source-channel region and, optionally, covering a part or whole of the heterosection and, optionally, part of the at least one channel region, but not covering the drain region. The length of the heterosection may be in the range of about 1 nm to 50 nm, for example between about 2 nm and 10 nm. The doping level of the heterosection in the short gate TFET of embodiments of the present invention may preferably be in the range of about $10^{18}$/cc to $10^{21}$/cc, for example in the range of about $10^{19}$/cc to $5\times10^{20}$/cc.

The short gate TFET of embodiments of the present invention may further comprise a gate dielectric underneath the gate electrode, the gate dielectric covering at least part of the at least one source region, extending up to the plane of the interface of the source-channel region and, optionally, covering part of the at least one channel region. The gate dielectric covers at least the parts of the source and channel regions also covered by the gate electrode. The gate dielectric may, optionally, also cover part of the channel and drain regions which are not covered by the gate electrode. In particular embodiments, the gate dielectric (e.g. oxide) may be selected from at least one of silicon based oxides (e.g. silicon dioxide, silicon oxy nitride), aluminum oxide, high-k oxides (oxides, nitrided oxides, silicates and nitrided silicates of transition metals such as Hf, Ta, Ti, Nb, V, Y, Zr). In particular embodiments the gate oxide is a high-k oxide such as hafnium oxide. The thickness of the gate dielectric, e.g. gate oxide, may be in the range of about 0.5 nm to 20 nm.

In embodiments of the present invention the gate electrode may be made of a conductive material. The conductive material may be selected from at least one of poly silicon, poly germanium, metals such as Al, W, Ta, Ti, Ru, Pd, Rh, Re, Pt, or alloys thereof, metal-nitrides such as TaN and TiN, metal-silicon nitrides such as TaSiN, conductive oxides such as $RuO_2$ or $ReO_3$, fully silicided metals (FUSI) such as $CoSi_2$, NiSi and $TiSi_2$, fully germanided metals (FUGE). The gate electrode material may be chosen such that a particular gate workfunction is obtained.

In particular embodiments, the at least one source region in the short gate TFET may be made of a semiconductor material which is highly p doped (or n doped).

In particular embodiments, the at least one drain region in the short gate TFET may be made of a semiconductor material which is highly n doped (or p doped).

The doping level of the source region and drain region in the short gate TFET of some embodiments of the present invention may be in the range of about $10^{18}$/cc to $10^{21}$/cc, for example in the range of about $10^{19}$/cc to $5\times10^{20}$/cc.

In particular embodiments, the at least one channel region in the short gate TFET may be made of a semiconductor material which is lowly n doped (or p doped) and which is situated in between the source and drain region.

The doping level of the channel region in the short gate TFET of embodiments of the present invention may be in the range of undoped up to about $10^{16}$/cc, for example in the range of undoped up to about $5\times10^{14}$/cc.

In particular embodiments, the semiconductor material of the source-channel-drain structure in the short gate TFET may be selected from at least one of group IV materials such as Si, Ge, C or binary compounds thereof, or group III/V materials such as In, Ga, As, Sb, Al, P, B, N or binary, tertiary or quaternary compounds thereof or group II/VI materials such as Cd, Zn, S, Se, Te, O or binary, tertiary or quaternary compounds thereof, or carbon nanotubes.

The short gate TFET of some embodiments of the present invention may further comprise an electrical contact on each of the source region and drain region. The electrical contact on each of the source region and drain region may be made from a conductive material which is selected from at least one of a silicide containing structure (NiSi, $CoSi_2$, $TiSi_2$, ...), a germanide containing structure, a metal containing structure, poly silicon or a combination thereof. In particular embodiments, the electrical contact on each of the source region and drain region may be a combination of a metal with a silicide.

In a second aspect of the invention, a method is provided for the fabrication of a short gate TFET. Hereinafter, the method according to an embodiment of the invention will be illustrated for a short gate TFET comprising one short (double) gate structure as shown in FIG. 4 (cross section). It has to be understood that this is not limiting the invention and that the method may also be applied to create the alternative short gate TFET structures (e.g. comprising a nanowire, a second gate structure, ...) as described above.

Figure 11:
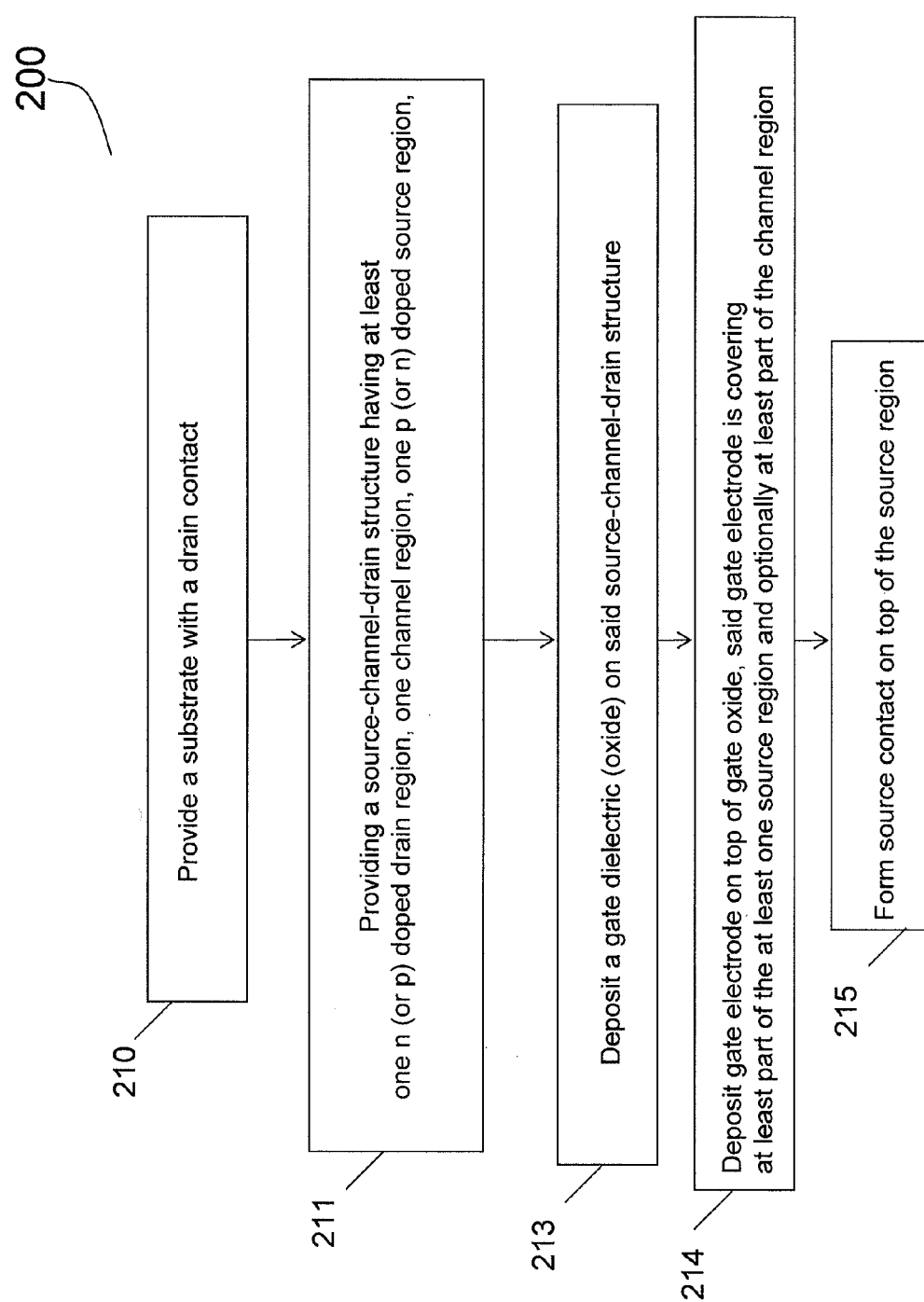
FIG. 11 illustrates a flowchart of a processing method according to embodiments of the present invention to fabricate a short gate TFET.

A particular processing method to fabricate a short gate TFET is schematically illustrated in a flowchart 200 shown in FIG. 11 and will be described in detail below (with reference to the cross-section in FIG. 4). It has, however, to be understood that this is only an example of a suitable method for forming a short gate NW-TFET device according to embodiments of the invention and that the sequence of the process steps as described hereinafter is not limiting the invention.

In a first process 210, a substrate is provided. Preferably the substrate is a semiconductor substrate such as a silicon substrate or a silicon on insulator (SOI) substrate but any other suitable substrate can be used as well such as, for example, glass, ceramics, etc. According to an embodiment of the invention, in the substrate or alternatively on top of the substrate, a drain contact 27 is created. The drain contact 27, may be made of a conductive material, e.g. the drain contact 27, may be a silicide containing structure (NiSi, $CoSi_2$, $TiSi_2$ ...), a germanide containing structure, a metal containing structure, polysilicon or a combination of the above materials. Also disclosed are drain contacts 27, formed of e.g. conductive oxides and even conductive polymers. In a particular embodiment, the drain contact 27 may be a silicide containing structure.

In a next process 211, a source-channel-drain structure having at least one n (or p) doped drain region, one channel region, and one p (or n) doped source region is formed. Deposition techniques such as, for example, CVD (Chemical Vapor Deposition), MOCVD (Metal Organic Chemical Vapor Deposition), or PECVD (plasma enhanced chemical vapor deposition) processes can be used. Alternatively etching techniques can be used whereby the structures are etched into the substrate.

The different regions with different doping levels and different doping types need to be created to form the drain region 22, the channel region 21 and the source region 20 in the source-channel-drain structure. These different regions can be doped during the deposition process to obtain a n-type or p-type region. Alternatively, the doping may be performed after the deposition process by means of an additional doping process. The doping in one specific region, e.g. source region/drain region is preferably uniform, but may also have a non-uniform doping profile.

A drain region 22 is created. The drain region 22 may be made of a first semiconductor material which is highly n doped in case of a n-type TFET, or alternatively in case of a p-type TFET the drain region is highly p doped. In embodiments of the present invention, the doping level of the drain region is in the range of $10^{18}$/cc to $10^{21}$/cc, for example in the range of $10^{19}$/cc to $5.10^{20}$/cc.

The channel region of the TFET is formed. In embodiments of the present invention, the channel region may preferably be made of the first semiconductor material, although other suitable/compatible materials can be used. In embodiments of the present invention, the doping level of the channel region may be in the range of undoped up to $10^{16}$/cc doping, for example in the range of undoped up to $10^{14}$/cc doping.

A source region 20 is created next to the channel region. The source region 20 may be made of the first semiconductor material, although other suitable/compatible materials can be used. The semiconductor material may be highly p doped in case of a n-type TFET (or alternatively in case of a p-type TFET the source region may be highly n doped). The doping level of the source region may be in the range of about $10^{18}$/cc to $10^{21}$/cc, for example in the range of about $10^{19}$/cc to $5.10^{20}$/cc.

In process 213 a short gate structure is formed onto part of the sidewalls of the source-channel-drain structure, more specifically a single gate, double gate or triple gate structure can be formed depending on the type of TFET (planar, MUGFET, horizontal, ...). First a gate dielectric (oxide) 29 is deposited. The gate dielectric is at least situated below the whole length of the gate electrode but can cover up to the whole length of the TFET structure, i.e. of the underlying source-channel-drain structure. Then, in process 214, a gate electrode 24 is deposited on top of the gate dielectric 29. The gate electrode is covering at least part of the source region extending at least up to the interface of the source-channel region and, optionally, part of the channel region such that there is a finite distance between the end of the gate electrode oriented towards the channel and the plane of the channel-drain interface, but such that there is no coverage by the gate electrode of the drain region.

The gate oxide 29 may be selected from at least one of silicon based oxides (e.g. silicon dioxide, silicon oxy nitride), aluminum oxide, high-k oxides (oxides, nitrided oxides, silicates and nitrided silicates of transition metals such as Hf, Ta, Ti, Nb, V, Y, Zr). In particular embodiments the gate oxide is a high-k oxide such as hafnium oxide. The thickness of the gate dielectric, e.g. gate oxide, is preferably in the range of 0.5 mm to 20 nm.

The gate electrode 24 may be made of a conductive material, for example selected from at least one of poly silicon, poly germanium, metals such as Al, W, Ta, Ti, Ru, Pd, Rh, Re, Pt, and alloys thereof, metal-nitrides such as TaN and TiN, metal-silicon nitrides such as TaSiN, conductive oxides such as $RuO_2$ and $ReO_3$, fully silicided metals (FUSI) such as $CoSi_2$, NiSi and $TiSi_2$, fully germanided metals (FUGE), workfunction tunable metals, engineered materials to obtain a particular gate workfunction. In particular embodiments the gate electrode is made of a metal of which the workfunction has been engineered specifically for the chosen channel material, the gate dielectric material, gate dielectric thickness and channel doping.

In process 215 an electrical contact is formed on the source region. The electrical contact may be a conductive material which is selected from at least one of a silicide containing structure (NiSi, CoSi$_2$, TiSi$_2$, . . . ), a germanide containing structure, a metal containing structure, poly silicon or a combination thereof. In particular embodiments the electrical contact may be a combination of a metal with a silicide.

An embodiment of a processing method to fabricate a short gate NW-TFET with optionally having a heterosection is schematically illustrated in a flowchart 300 shown in FIG. 12 and will be described in detail below (with reference to the cross-section in FIG. 10B). It has, however, to be understood that this is only an example of a suitable method for forming a short gate NW-TFET device according to embodiments of the invention and that the sequence of the process as described hereinafter is not limiting the invention.

In process 310, a substrate is provided. The substrate may be a semiconductor substrate such as a silicon substrate or a silicon on insulator (SOI) substrate but any other suitable substrate can be used as well such as, for example, glass, ceramics, etc. According to an embodiment of the invention, in the substrate or alternatively on top of the substrate, a drain contact 27 is created. The drain contact 27, may be made of a conductive material, e.g. the drain contact 27, may be a silicide containing structure (NiSi, CoSi$_2$, TiSi$_2$ . . . ), a germanide containing structure, a metal containing structure, polysilicon or a combination thereof. Also disclosed are drain contacts 27, formed of e.g. conductive oxides and even conductive polymers. In case the drain contact 27 is a metal containing structure, all metals which form an ohmic contact with the material of a nanowire, or in other words all metals having a comparable work function with respect to the work function of the channel material, may be used according to embodiments of the invention. In particular embodiments, the drain contact 27 is a silicide containing structure. The drain contact 27, can be the starting point for growing the nanowire and can, at the same time, act as the catalyst for the nanowire growth. However, the latter is not essential.

In case the drain contact 27 cannot be used as a catalyst for the subsequent nanowire growth, a catalyst needs to be deposited onto the drain contact in process 311. Furthermore, the requirement of catalyst particles also depends on the technique used to form the nanowire.

In a next process 312, a nanowire is grown, e.g. by means of a VLS (Vapor-Liquid-Solid) process, but also any other suitable technique known by a person skilled in the art may be used to form the nanowires according to embodiments of the invention. For example, the nanowire may be grown using techniques such as CVD (Chemical Vapor Deposition), MOCVD (Metal Organic Chemical Vapor Deposition), or PECVD (plasma enhanced chemical vapor deposition) processes. Alternatively, also PLD (Pulsed Laser Deposition), ECD (Electrochemical Deposition), e-beam or MBE (Molecular Beam Epitaxy) processes may be used to grow the nanowires.

During growth of the nanowire, different regions with different doping levels and different doping types are created to form the drain region 22, the channel region 21, the source region 20 and (optionally) the heterosection 30 of the nanowire. The different regions in the nanowire can be doped during the growth process to obtain a n-type or p-type region. Alternatively, the doping of the nanowire may be performed after growth of the nanowire by means of an additional doping process. The doping in one specific region, e.g. source region/drain region is preferably uniform, but may also have a non-uniform doping profile.

During growth of the nanowire, a drain region 22 is created. The drain region 22 may be made of a first semiconductor material which is highly n doped in case of a n-type NW-TFET, or alternatively in case of a p-type NW-TFET the drain region is highly p doped. The doping level of the drain region may be in the range of about $10^{18}$/cc to $10^{21}$/cc, for example in the range of about $10^{19}$/cc to $5.10^{20}$/cc.

The channel region of the NW-TFET is formed in the nanowire. The channel region may be made of the first semiconductor material, although other suitable/compatible materials can be used. The doping level of the channel region may be in the range of undoped up to about $10^{16}$/cc, for example in the range of undoped up to about $10^{14}$/cc doping.

Optionally, in a process (to create e.g. an n-type NW-TFET), a heterosection 30 may be formed. The heterosection 30 may be made of a second semiconductor material which is such that it has a different lattice constant compared to the lattice constant of the first semiconductor material used to form the channel region 21 of the nanowire. The second semiconductor material may be highly doped. The second semiconductor material may be selected from at least one of the group IV materials such as Si, Ge, C or binary compounds thereof, or group III/V materials such as In, Ga, As, Sb, Al, P, B, N or binary, tertiary or quaternary compounds thereof or group II/VI materials such as Cd, Zn, S, Se, Te, O or binary, tertiary or quaternary compounds thereof. In particular embodiments the second semiconductor material is germanium or Si$_{1-x}$Ge$_x$ with x>0.5. The doping level of the heterosection may be in the range of about $10^{18}$/cc to $10^{21}$/cc, for example in the range of about $10^{19}$/cc to $5\times10^{20}$/cc.

Alternatively, the heterosection can be made of metals (Al, W, Ta, Ti, Ru, Pd, Rh, Re, Pt, or alloys thereof), silicides, germanides, metal-nitrides such as TaN and TiN, conductive oxides such as RuO$_2$ and ReO$_2$, silicided metals such as CoSi$_2$, NiSi$_2$, metal germanides or alloys or mixtures thereof.

In a process, a source region 20 is created on top of the channel region (or if a heterosection is present on top of the heterosection). The source region 20 may be made of a first semiconductor material which is highly p doped in case of a n-type NW-TFET (or alternatively in case of a p-type NW-TFET the source region is highly n doped). The doping level of the source region may be in the range of about $10^{18}$/cc to $10^{21}$/cc, for example in the range of about $10^{19}$/cc to $5.10^{20}$/cc.

In a process 313,314 a gate structure may be formed onto the sidewalls of the nanowire, more specifically for example an all-around gate structure. First a gate dielectric (e.g. oxide) 29 may be deposited. The gate dielectric may at least be situated below the whole length of the gate electrode (to be formed later on) but can cover up to the whole length of the NW-TFET structure. Then a gate electrode 24 is deposited on top of the gate dielectric 29. The gate electrode covers at least part of the source region extending up to the plane of the interface of the source-channel region and, optionally, the heterosection and, also optionally, part of the channel region such that there is a finite distance between the end of the gate electrode oriented towards the channel and the plane of the channel-drain interface, such that there is no coverage by the gate electrode of the drain region.

The gate dielectric 29 may be an oxide, for example selected from at least one of silicon based oxides (e.g. silicon dioxide, silicon oxy nitride), aluminum oxide, high-k oxides (oxides, nitrided oxides, silicates or nitrided silicates of transition metals such as Hf, Ta, Ti, Nb, V, Y, Zr). In particular embodiments the gate oxide may be a high-k oxide such as hafnium oxide. The thickness of the gate dielectric, e.g. gate oxide, may preferably be in the range of about 0.5 nm to 20 nm.

The gate electrode 24 may be made of a conductive material, for example selected from at least one of poly silicon, poly germanium, metals such as Al, W, Ta, Ti, Ru, Pd, Rh, Re, Pt, or alloys thereof, metal-nitrides such as TaN and TiN, metal-silicon nitrides such as TaSiN, conductive oxides such as $RuO_2$ and $ReO_3$, fully silicided metals (FUSI) such as $CoSi_2$, NiSi and $TiSi_2$, fully germanided metals (FUGE), workfunction tunable metals, engineered materials to obtain a particular gate workfunction. In particular embodiments, the gate electrode may be made of a metal of which the workfunction has been engineered specifically for the chosen channel material, the gate dielectric material, gate dielectric thickness and channel doping.

In process 315 an electrical contact is formed on the source region (situated on top of the nanowire). The electrical contact may be made of a conductive material, which for example may be selected from at least one of a silicide containing structure (NiSi, $CoSi_2$, $TiSi_2$, . . . ), a germanide containing structure, a metal containing structure, poly silicon or a combination thereof. In particular embodiments, the electrical contact is a combination of a metal with a silicide.

In case the nanowire is not doped during the growth process, an extra doping process may be necessary. For example, implantation of dopant elements followed by activation of the dopant elements by e.g. annealing can be applied to achieve n-type or p-type regions in the nanowire. Alternatively, a layer, which is also referred to as dopant layer and which comprises dopant elements can be deposited or a dopant metal can be selectively deposited, e.g. with electrochemical deposition, onto the nanowire regions (not shown). An anneal process may then be applied so as to incorporate the dopant elements into the nanowire region, resulting in an n-type or p-type region.

The whole processing sequence to obtain a short gate NW-TFET, as shown for example in FIG. 12 and as described in the previous processes can be repeated to build a second short gate NW-TFET structure on top of the existing NW-TFET structure starting on the source contact. In case the first NW-TFET structure is an n-type NW-TFET structure, the second structure may for example be a p-type NW-TFET structure.

EXAMPLES

Example 1

Simulations Performed with Device Simulator MEDICI to Determine the Characteristics of an all Silicon Short Gate TFET The simulations are performed with device simulator "MEDICI" to determine the characteristics of an all silicon short gate TFET. The short gate TFET structure used for the simulation is shown in FIG. 4. The short gate TFET structure is 2-dimensional and has a double-gate. The height of the central part (between the gate dielectrics 29) is 20 nm, and the height of the gate dielectric (hafnium oxide) is 4 nm. The length of the channel region is in one embodiment 100 nm and in another embodiment 1000 mm.

The most important dimensions in the short gate TFET structure to be taken into account for the electrical performance are the length of the short gate $L_{gate}$=30 nm (short gate) and full gate (full coverage of channel) and the length of the channel region which is in the above embodiments of this example either 100 nm or 1000 nm. The gate-source overlap is in the example 5 nm.

Further parameters of importance are the doping of the source and drain regions. The doping of the source region is in the example p-type doping, the doping level is $10^{20}$/cc. The doping of the drain region is in the example n-type doping, the doping level is $10^{20}$/cc. The doping of the channel region is not critical, as long as it is lowly doped. The doping level for the channel region used in this simulation example is p-type, $10^{15}$/cc.

Figure 5:
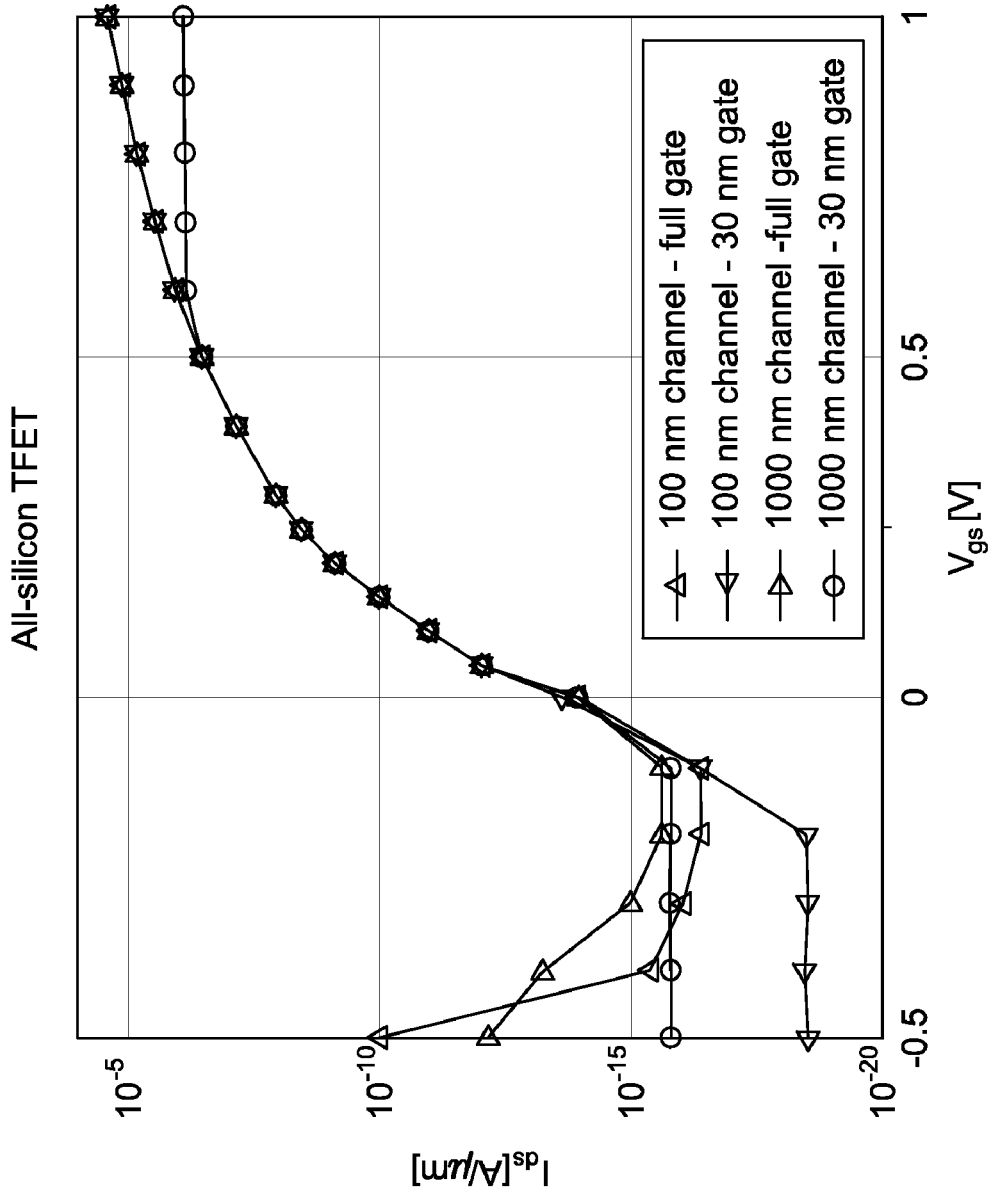
FIG. 5 illustrates simulated output characteristics for an all silicon TFET with a 100 nm and 100 nm channel having a full gate or partial gate according to embodiments of the present invention (gate length=30 nm) after applying a drain voltage, $V_{DS}$=1 V. The Figure illustrates the drain current IDS as a function of gate voltage $V_{GS}$ (varied from −0.5V up to 1V)

FIG. 5 shows simulated output characteristics for the all silicon TFET with a 100 nm and 1000 nm channel having a full gate or partial gate (gate length=30 nm) after applying a drain voltage, $V_{DS}$=1 V. The FIG. shows the drain current $I_{DS}$ as a function of gate voltage $V_{GS}$ (varied from −0.5V up to 1V).

The off-currents are very low. The onset of ambipolar behavior can however already be observed for the configurations with the full gate. The on-currents are identical for the two configurations with the 100 nm channel, which means that there is no performance degradation by having a shorter gate. The on-current for the 1000 nm channel is smaller for the short-gate configuration, and illustrates that if the gate becomes too short compared to the total channel length, it can affect the on-current and therefore the performance of the TFET.

Example 2

Simulations Performed with Device Simulator MEDICI to Determine the Characteristics of an all Germanium Short Gate TFET The simulations are performed with device simulator "MEDICI" to determine the characteristics of an all germanium short gate TFET. The short gate TFET structure used for the simulation is shown in FIG. 4. The short gate TFET structure is 2-dimensional and has a double-gate. The height of the central part (between the gate dielectrics 29) is 20 nm, and the height of the gate dielectric (hafnium oxide) is 4 nm. The length of the channel region is 100 nm, and the length of the short gate is 95 nm (=5 nm overlap with the source, 10 nm gap between gate and drain electrode) versus a full gate (100 nm+2×5 nm (for gate/source and gate/drain overlap) or full coverage).

The most important dimensions in the short gate TFET structure to be taken into account for the electrical performance are the length of the short gate $L_{gate}$=95 nm (short gate) and full gate $L_{gate}$=110 nm (full coverage of channel) and the length of the channel region.

Further parameters of importance are the doping of the source and drain regions. The doping of the source region is in the example p-type doping, the doping level is $10^{20}$/cc. The doping of the drain region is in the example n-type doping, the doping level is $10^{20}$/cc. The doping of the channel region is not critical, as long as it is lowly doped. The doping level for the channel region used in this simulation example is n-type, $10^{13}$/cc. The doping of the channel region is not critical, as long as it is lowly doped.

Figure 6:
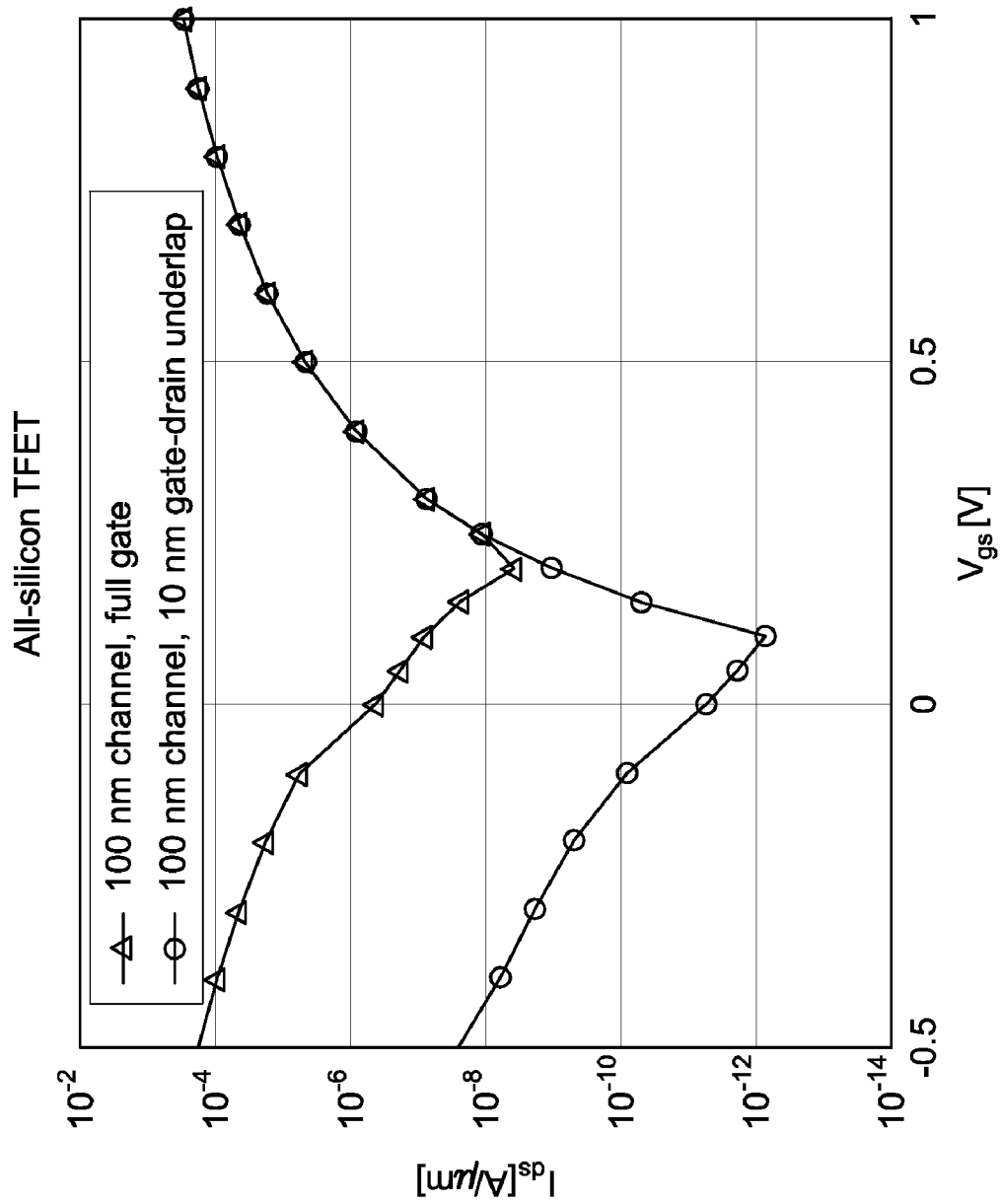
FIG. 6 illustrates simulated output characteristics for an all germanium TFET with a 100 nm channel having a full gate or partial gate according to embodiments of the present invention (gate length=95 nm having 5 nm gate-source overlap) after applying a drain voltage, $V_{DS}=1$ V. The Figure illustrates the drain current IDS as a function of gate voltage $V_{GS}$ (varied from −0.5V up to 1V)

FIG. 6 shows simulated output characteristics for the all germanium TFET with a 100 nm channel having a full gate or partial gate (gate length=95 nm) after applying a drain voltage, $V_{DS}$=1 V. The Figure shows the drain current IDS as a function of gate voltage $V_{GS}$ (varied from −0.5V up to 1V).

The off-current is 4 orders of magnitude smaller for the configuration with the shorter gate, than the configuration with the full gate. The short gate TFET therefore reduces the ambipolar behavior significantly. The on-currents are identical for the two configurations, which means that there is no performance degradation by having a shorter gate.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A tunnel field effect transistor (TFET) comprising:
a source-channel-drain structure comprising at least one doped source region, at least one doped drain region, and at least one channel region situated between the source region and the drain region and forming a source-channel interface with the source region and a drain-channel interface with the drain region, wherein the doped source region and the doped drain region are oppositely doped; and
a gate electrode which covers at least part of the source region, the gate electrode at least extending up to the source-channel interface such that there is a finite distance between the end of the gate electrode and the plane of the channel-drain interface and such that there is no coverage by the gate electrode of the drain region and such that a section of the channel region which is not covered by the gate electrode is not bypassed by a parallel conductive path to the drain.

2. The tunnel field effect transistor according to claim 1, further comprising a gate dielectric covering at least part of the source region along the longitudinal direction thereof, the gate dielectric being between the source-channel-drain structure and the gate electrode, the gate electrode not extending beyond the gate dielectric.

3. The tunnel field effect transistor according to claim 1, wherein the source-channel-drain structure is a planar structure and the gate electrode is a single gate structure situated on top of the planar source-channel-drain structure.

4. The tunnel field effect transistor according to claim 1, wherein the source-channel-drain structure is a horizontal structure and the gate electrode is a double gate structure situated on the sidewalls of the horizontal source-channel-drain structure.

5. The tunnel field effect transistor according to claim 1, wherein the source-channel-drain structure is a horizontal structure and the TFET is a triple-gate FET and the gate electrode is a triple gate structure situated on the sidewalls and on top of the source-channel-drain structure of the triple-gate FET.

6. The tunnel field effect transistor according to claim 1, wherein the source-channel-drain structure is a horizontal or a vertical structure and the gate electrode is an all-around gate structure around the horizontal or vertical source-channel-drain structure.

7. The tunnel field effect transistor according to claim 1, wherein the TFET is a nanowire TFET and wherein the nanowire forms at least the channel region and wherein gate electrode is an all-around gate structure.

8. The tunnel field effect transistor according to claim 1, wherein the tunnel field effect transistor is a nanowire-TFET comprising a heterosection in the source-channel-drain structure and wherein the heterosection is made of a semiconductor material different from the overall semiconductor material of the source-channel-drain structure of the TFET.

9. The tunnel field effect transistor according to claim 8, wherein the length of the heterosection is in the range between about 1 nm and 50 nm.

10. The tunnel field effect transistor according to claim 8, wherein the doping level of the heterosection is in the range of about $10^{18}$/cc to $10^{21}$/cc.

11. The tunnel field effect transistor according to claim 1, further comprising a second short gate structure on the remainder of the channel region.

12. The tunnel field effect transistor according to claim 1, wherein the source region is made of a semiconductor material which is doped with a first dopant, the drain region is made of a semiconductor material which is doped with a second dopant and wherein the doping level of the source region and drain region are in the range of about $10^{18}$/cc to $10^{21}$/cc.

13. The tunnel field effect transistor according to claim 1, wherein the at least one channel region is made of a semiconductor material which is doped with a doping level in the range from undoped up to about $10^{16}$/cc.

14. The tunnel field effect transistor according to claim 1, wherein the length of the channel region ($L_{channel}$) in the TFET is in the range of about 5 nm to 50 μm.

15. The tunnel field effect transistor according to claim 1, wherein the length of the gate electrode ($L_{gate}$) is between about 1 nm and 50 μm.

16. The tunnel field effect transistor according to claim 1, wherein the length of the channel region which is not covered by a gate electrode ($L_{no\ overlap}$) is in the range of about 1 nm up to the whole length of the channel region.

17. The tunnel field effect transistor according to claim 1, wherein the at least one channel region is lowly doped or undoped.

18. The tunnel field effect transistor according to claim 1, wherein the doped source region is a p-doped source region and wherein the doped drain region is an n-doped drain region.

19. The tunnel field effect transistor according to claim 1, wherein the doped source region is an n-doped source region and wherein the doped drain region is a p-doped drain region.

20. A tunnel field effect transistor comprising:
a channel region situated between a doped source region and a doped drain region, wherein the doped source region and the doped drain region are oppositely doped; and
a gate electrode which covers at least a part of the doped source region and does not cover the doped drain region, wherein a section of the channel region which is not covered by the gate electrode is not bypassed by a parallel conductive path to the drain.

21. The tunnel field effect transistor according to claim 20, wherein the channel region is lowly doped or undoped.

22. The tunnel field effect transistor according to claim 20, wherein the channel region is made of a semiconductor material which is doped with a doping level in the range from undoped up to about $10^{16}$/cc.

* * * * *

UNITED STATES PATENT AND TRADEMARK OFFICE
CERTIFICATE OF CORRECTION

PATENT NO. : 8,120,115 B2
APPLICATION NO. : 12/044719
DATED : February 21, 2012
INVENTOR(S) : Vandenberghe et al.

It is certified that error appears in the above-identified patent and that said Letters Patent is hereby corrected as shown below:

| Issued Patent | | Description of Discrepancy |
|---|---|---|
| Column | Line | |
| On the Title page (Item 75) Inventors | | Change "Herverlee, (BE);" for William G. Vandenberghe to --Heverlee, (BE);-- |
| 9 | 5 | Change "suicides," to --silicides,--. |
| 10 | 63 | Change "and 100" to --and 1000--. |
| 10 | 66 | Change "IDS" to --$I_{DS}$--. |
| 11 | 6 | Change "IDS" to --$I_{DS}$--. |
| 11 | 7 | Change "1V)," to --1V);--. |
| 18 | 51 | Change "mm" to --nm--. |
| 20 | 40 | Change "CC." to --cc.--. |
| 21 | 55 | Change "mm." to --nm.--. |
| 22 | 56 | Change "IDS" to --$I_{DS}$--. |

Signed and Sealed this
Twenty-fifth Day of September, 2012

David J. Kappos
*Director of the United States Patent and Trademark Office*